(12) United States Patent
Nosaka et al.

(10) Patent No.: US 10,644,673 B2
(45) Date of Patent: May 5, 2020

(54) RADIO FREQUENCY FILTER CIRCUIT, DUPLEXER, RADIO FREQUENCY FRONT END CIRCUIT, AND COMMUNICATION APPARATUS

(71) Applicant: Murata Manufacturing Co., Ltd., Kyoto (JP)

(72) Inventors: Koji Nosaka, Kyoto (JP); Takaya Wada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 84 days.

(21) Appl. No.: 16/056,851

(22) Filed: Aug. 7, 2018

(65) Prior Publication Data
US 2019/0097606 A1    Mar. 28, 2019

Related U.S. Application Data

(63) Continuation of application No. PCT/JP2017/004462, filed on Feb. 7, 2017.

(30) Foreign Application Priority Data

Feb. 8, 2016    (JP) ................................ 2016-022211

(51) Int. Cl.
*H03H 9/64*   (2006.01)
*H04B 1/48*   (2006.01)
(Continued)

(52) U.S. Cl.
CPC ........ *H03H 9/6483* (2013.01); *H03H 9/0542* (2013.01); *H03H 9/542* (2013.01);
(Continued)

(58) Field of Classification Search
CPC .... H03H 9/6483; H03H 9/0542; H03H 9/542; H03H 9/568; H03H 9/605; H03H 9/6403;
(Continued)

(56) References Cited

U.S. PATENT DOCUMENTS 6,472,953 B1   10/2002  Sakuragawa et al.
6,483,399 B1   11/2002  Atokawa
(Continued)

FOREIGN PATENT DOCUMENTS

JP   2000-323961 A   11/2000
JP   2001-160766 A    6/2001
(Continued)

OTHER PUBLICATIONS

International Search Report for International Application No. PCT/JP2017/004462, dated May 9, 2017.
(Continued)

*Primary Examiner* — Benny T Lee
*Assistant Examiner* — Hafizur Rahman
(74) *Attorney, Agent, or Firm* — Pearne & Gordon LLP

(57) ABSTRACT

A radio frequency filter circuit (22A) includes a series-arm resonator (22s), a parallel-arm resonator (22p1), a parallel-arm resonator (22p2) that is connected between a node x1 and a ground terminal, a switch (22SW) that is arranged between the node x1 and the ground terminal and switches between electrical connection and electrical non-connection of a path connecting the node x1, the parallel-arm resonator (22p2), and the ground terminal. The parallel-arm resonator (22p1) and a series circuit in which the parallel-arm resonator (22p2) and the switch (22SW) are connected in series are connected in parallel between the node x1 and the ground terminal. A resonant frequency (frp) of the parallel-arm resonator (22p1) is lower than a resonant frequency (frs) of the series-arm resonator (22s). A resonant frequency (frp2) of the parallel-arm resonator (22p2) is higher than the resonant frequency (frp) of the parallel-arm resonator (22p1).

19 Claims, 20 Drawing Sheets

(51) Int. Cl.
*H04B 1/00* (2006.01)
*H04B 1/40* (2015.01)
*H03H 9/56* (2006.01)
*H03H 9/60* (2006.01)
*H03H 9/70* (2006.01)
*H03H 9/05* (2006.01)
*H03H 9/72* (2006.01)
*H03H 9/54* (2006.01)

(52) U.S. Cl.
CPC ............ *H03H 9/568* (2013.01); *H03H 9/605* (2013.01); *H03H 9/6403* (2013.01); *H03H 9/6406* (2013.01); *H03H 9/706* (2013.01); *H03H 9/72* (2013.01); *H03H 9/725* (2013.01); *H04B 1/00* (2013.01); *H04B 1/006* (2013.01); *H04B 1/40* (2013.01); *H04B 1/48* (2013.01)

(58) Field of Classification Search
CPC ........ H03H 9/6406; H03H 9/706; H03H 9/72; H03H 9/725; H04B 1/006; H04B 1/40; H04B 1/48; H04B 1/00
USPC ........................................................ 333/126
See application file for complete search history.

(56) References Cited

U.S. PATENT DOCUMENTS

2016/0301383 A1    10/2016   Tani
2017/0264268 A1*    9/2017   Schmidhammer ..... H03H 9/568

FOREIGN PATENT DOCUMENTS

| | | |
|---|---|---|
| JP | 2005-051656 A | 2/2005 |
| JP | 2008-124556 A | 5/2008 |
| JP | 2008-219748 A | 9/2008 |
| JP | 2009-130831 A | 6/2009 |
| JP | 2015-115866 A | 6/2015 |
| JP | 2015-179982 A | 10/2015 |
| WO | 2015/099105 A1 | 7/2015 |

OTHER PUBLICATIONS

Written Opinion for International Application No. PCT/JP2017/004462, dated May 9, 2017.

* cited by examiner

RESONANT FREQUENCY OF PARALLEL-ARM RESONATOR 225p2
<RESONANT FREQUENCY OF PARALLEL-ARM RESONATOR 226p2
<RESONANT FREQUENCY OF PARALLEL-ARM RESONATOR 227p2

RADIO FREQUENCY FILTER CIRCUIT, DUPLEXER, RADIO FREQUENCY FRONT END CIRCUIT, AND COMMUNICATION APPARATUS

This is a continuation of International Application No. PCT/JP2017/004462 filed on Feb. 7, 2017 which claims priority from Japanese Patent Application No. 2016-022211 filed on Feb. 8, 2016. The contents of these applications are incorporated herein by reference in their entireties.

BACKGROUND

Technical Field

The present disclosure relates to a radio frequency filter circuit, a duplexer, a radio frequency front end circuit, and a communication apparatus each including a resonator.

Conventionally, acoustic wave filters that use acoustic waves have been widely used as band pass filters arranged in a front end unit of a mobile communication apparatus. Furthermore, in order to support combined configurations such as a multimode/multiband configuration, radio frequency front end circuits including a plurality of acoustic wave filters have been put into practice.

In Patent Document 1, a configuration of a front end circuit that includes a demultiplexer that is able to support a combination of many frequency bands is disclosed. FIG. 19 is a block diagram of a front end circuit described in Patent Document 1. The front end circuit illustrated in FIG. 13 includes a demultiplexer 601, switches 651 and 652 of an SPDT (Single Pole Double Throw) type, duplexers 661 to 664, and an antenna 609. The demultiplexer 601 includes an LPF (low pass filter) 610, BPFs (band pass filters) 620 and 630, and an HPF (high pass filter) 640. A common terminal of the switch 651 is connected to the LPF 610 with a terminal 603 interposed therebetween, and the duplexers 661 and 662 corresponding to two frequency bands allocated to a lower frequency side are connected to selection terminals of the switch 651. Furthermore, a common terminal of the switch 652 is connected to the HPF 640 with a terminal 604 interposed therebetween, and the duplexers 663 and 664 corresponding to two frequency bands allocated to a higher frequency side are connected to selection terminals of the switch 652. With the above configuration, selection between the two adjacent frequency bands on the lower frequency side is performed by switching of the switch 651, and the duplexer 661 or 662 enters an electrically connected state in an exclusive manner. Furthermore, selection between the two adjacent frequency bands on the higher frequency side is performed by switching of the switch 652, and the duplexer 663 or 664 enters an electrically connected state in an exclusive manner.

Patent Document 1: Japanese Unexamined Patent Application Publication No. 2015-115866

BRIEF SUMMARY

However, in the known front end circuit described above, each of the circuit for exclusively switching between two frequency bands on the lower frequency side and the circuit for exclusively switching between two frequency bands on the higher frequency side requires two duplexers and a switch of the SPDT type. Even only for a transmission-side path or a reception-side path, two band pass filters and a switch of the SPDT type are required. Therefore, a circuit configuration is complicated, and the circuit size increases.

Thus, the present disclosure has been designed to solve the above-mentioned problems, and the present disclosure provides a radio frequency filter circuit, a duplexer, a radio frequency front end circuit, and a communication apparatus that have simple and compact circuit configurations and are capable of switching between signal paths of two frequency bands.

A radio frequency filter circuit according to an aspect of the present disclosure includes a series-arm resonator that is connected between an input terminal and an output terminal; a first parallel-arm resonator that is connected between a ground terminal and a node on a path connecting the input terminal, the series-arm resonator, and the output terminal; a second parallel-arm resonator that is connected between the node and the ground terminal; and a switch element that is arranged between the node and the ground terminal and switches between electrical connection and electrical non-connection of a path connecting the node, the second parallel-arm resonator, and the ground terminal. The first parallel-arm resonator and a series circuit in which the second parallel-arm resonator and the switch element are connected in series are connected in parallel between the node and the ground terminal. A resonant frequency of the first parallel-arm resonator is lower than a resonant frequency of the series-arm resonator. A resonant frequency of the second parallel-arm resonator is higher than the resonant frequency of the first parallel-arm resonator.

With the above configuration, in the filter circuit of a band pass type including the series-arm resonator and the parallel-arm resonators, in the case where the switch element is in an electrically non-connected state, the series-arm resonator and the first parallel-arm resonator form first transmission characteristics. Furthermore, in the case where the switch element is in an electrically connected state, the series-arm resonator and the combined resonator of the first and second parallel-arm resonators form second transmission characteristics that are different from the first transmission characteristics.

In the combined characteristics of the first and second parallel-arm resonators, a resonant point of the second parallel-arm resonator exists on a higher frequency side relative to a resonant point of the first parallel-arm resonator and on a lower frequency side relative to an anti-resonant point of the series-arm resonator. Furthermore, in the combined characteristics of the first and second parallel-arm resonators, a first anti-resonant point reflecting the first parallel-arm resonator is at a frequency lower than that of an anti-resonant point of the first parallel-arm resonator, and therefore, the second transmission characteristics can narrow the band width compared to the first transmission characteristics. That is, by switching of the switch element, the pass band of the filter circuit can be adjusted. In a related art, a filter circuit applied to a system for exclusively selecting between two bands requires two filter circuits and an SPDT-type switch for switching between the two filters. In contrast, this configuration can be achieved by a filter circuit and a switch element of an SPST (Single Pole Single Throw) type. Therefore, simplification and miniaturization of a filter circuit can be achieved.

Furthermore, the resonant frequency of the second parallel-arm resonator may be higher than the resonant frequency of the series-arm resonator and may be lower than an anti-resonant frequency of the series-arm resonator.

With this configuration, the resonant frequency of the second parallel-arm resonator is higher than the resonant frequency of the series-arm resonator that affects insertion loss near the center frequency in the pass band and is lower than the anti-resonant frequency of the series-arm resonator corresponding to the attenuation pole on the higher frequency side outside the pass band. Accordingly, in the case where the switch element is electrically connected, the attenuation pole on the higher frequency side outside the pass band can be shifted toward a lower frequency side while low loss characteristics within the pass band being maintained. Therefore, in the case where the switch element is electrically connected, the higher frequency end of the pass band can be shifted toward the lower frequency side, and the pass band width can thus be narrowed without necessarily steepness of the transmission characteristics being impaired.

Furthermore, in a case where the path is electrically non-connected, the radio frequency filter circuit may allow, by the series-arm resonator and the first parallel-arm resonator, a radio frequency signal in a first frequency band to pass from the input terminal to the output terminal. In a case where the path is electrically connected, the radio frequency filter circuit may allow, by the series-arm resonator and a combined resonant circuit of the first and second parallel-arm resonators, a radio frequency signal in a second frequency band that is different from the first frequency band to pass from the input terminal to the output terminal. A higher frequency end of the second frequency band may be lower than a higher frequency end of the first frequency band.

With this configuration, a simplified and miniaturized filter circuit can be applied to a system for exclusively selecting and using between two frequency bands.

Furthermore, the first frequency band and the second frequency band may partially overlap or may be adjacent to each other.

With this configuration, a simplified and miniaturized filter circuit may be applied to a system for exclusively selecting and using between two frequency bands that partially overlap or are adjacent to each other.

Furthermore, a plurality of resonant circuits each including the second parallel-arm resonator and the switch element that are connected in series may be connected in parallel between the node and the ground terminal. Resonant frequencies of the second parallel-arm resonators included in the plurality of resonant circuits may be different from one another.

Accordingly, in the first pass band characteristics defined by the series-arm resonator and the first parallel-arm resonator, by desirably selecting a switch element of a resonant circuit to be electrically connected, from among the plurality of resonant circuits each including the second parallel-arm resonator and the switch element, fine adjustment of the band width can be achieved.

Furthermore, the radio frequency filter circuit may include filter structures of a plurality of stages each including the series-arm resonator and the first parallel-arm resonator. The filter structures of two or more stages among the plurality of stages may each include the second parallel-arm resonator and the switch element.

Accordingly, in the pass band characteristic defined by the ladder filter structures of the plurality of stages, by desirably selecting a switch element to be electrically connected and the number of switch elements to be electrically connected, fine adjustment of the band width can be achieved.

Furthermore, the radio frequency filter circuit may further include an inductor that is connected in series between the second parallel-arm resonator and the switch element.

By inserting the inductor in series between the second parallel-arm resonator and the switch element, the resonant frequency of the resonant circuit including the second parallel-arm resonator decreases. Therefore, a higher resonant frequency can be designed for the second parallel-arm resonator taking into consideration the decrease in the frequency. Consequently, the second parallel-arm resonator can be miniaturized, and space saving can be achieved.

Furthermore, a capacitance when the switch element is not electrically connected may be 0.8 pF or less.

Accordingly, the frequency variable width can be increased.

Furthermore, a characteristic impedance of wiring that connects the second parallel-arm resonator and the switch element may be 20Ω or more.

Accordingly, the frequency variable width can be increased.

Furthermore, the radio frequency filter circuit may further include a longitudinally-coupled filter circuit that is arranged between the input terminal and the output terminal.

Accordingly, the transmission characteristics defined by the longitudinally-coupled filter circuit can be adjusted by switching of the switch element.

Furthermore, the series-arm resonator, the first parallel-arm resonator, and the second parallel-arm resonator may be surface acoustic wave resonators or acoustic wave resonators using BAW.

Accordingly, the radio frequency filter circuit can be configured by a piezoelectric element using elastic waves, and therefore, a compact radio frequency filter circuit having high-steepness transmission characteristics can be achieved.

Furthermore, the series-arm resonator, the first parallel-arm resonator, and the second parallel-arm resonator may include interdigital transducer electrodes formed on a one piezoelectric substrate.

Accordingly, the radio frequency filter circuit can be configured by an interdigital transducer electrode using surface acoustic waves, and therefore, a compact and low-profile radio frequency filter circuit having high-steepness transmission characteristics can be achieved.

Furthermore, the switch element may be an FET switch formed of GaAs or CMOS or a diode switch.

Accordingly, a switch element can be configured by an FET switch or a diode switch, and therefore, a compact radio frequency filter circuit can be achieved.

In a duplexer according to an aspect of the present disclosure, any one of a transmission-side filter circuit and a reception-side filter circuit may include the radio frequency filter circuit described above.

Accordingly, in the tunable duplexer applied to a system for exclusively selecting between two bands adjacent to each other, the duplexer can be simplified and miniaturized.

Furthermore, a radio frequency front end circuit according to an aspect of the present disclosure may include a controller that controls electrical connection and electrical non-connection of the plurality of switch elements; and the radio frequency filter circuit described above. The controller may control electrical connection and electrical non-connection of the plurality of switch elements individually.

Accordingly, in the first pass band characteristics defined by the series-arm resonator and the first parallel-arm resonator, by selecting the plurality of switch elements separately, transmission characteristics corresponding to three or more frequency bands can be selected properly.

Furthermore, a radio frequency front end circuit according to an aspect of the present disclosure may include a controller that controls electrical connection and electrical non-connection of the switch element; a power amplifier that amplifies a radio frequency transmission signal; and the radio frequency filter circuit or duplexer described above through which the radio frequency transmission signal amplified by the power amplifier passes.

Accordingly, the transmission-system front end circuit including the power amplifier can be simplified and miniaturized.

Furthermore, a radio frequency front end circuit according to an aspect of the present disclosure may include a controller that controls electrical connection and electrical non-connection of the switch element; the radio frequency filter circuit or duplexer described above through which a radio frequency reception signal received by an antenna element passes; and a low noise amplifier that amplifies the radio frequency reception signal output from the radio frequency filter circuit or the duplexer.

Accordingly, the reception-system front end circuit including the low noise amplifier can be simplified and miniaturized.

Furthermore, a communication apparatus according to an aspect of the present disclosure includes an RF signal processing circuit that processes a baseband signal or a radio frequency signal; and the radio frequency front end circuit described above.

Accordingly, the communication apparatus can be simplified and miniaturized.

With a radio frequency filter circuit according to the present disclosure, exclusive switching between signal paths of two frequency bands can be performed using a simplified and miniaturized circuit configuration.

BRIEF DESCRIPTION OF THE SEVERAL VIEWS OF THE DRAWINGS

FIG. 5B is a graph illustrating impedance characteristics and transmission characteristics in the case where the switch of the radio frequency filter circuit according to the first embodiment is on.

FIG. 5C is a graph illustrating a comparison of impedance characteristics and transmission characteristics between the case where the switch of the radio frequency filter circuit according to the first embodiment is off and the case where the switch of the radio frequency filter circuit is on.

FIG. 14 is a graph illustrating a comparison of impedance characteristics and transmission characteristics between a case where a switch of the radio frequency filter circuit according to the third embodiment is off and a case where the switch of the radio frequency filter circuit is on.

DETAILED DESCRIPTION

Figure 1:
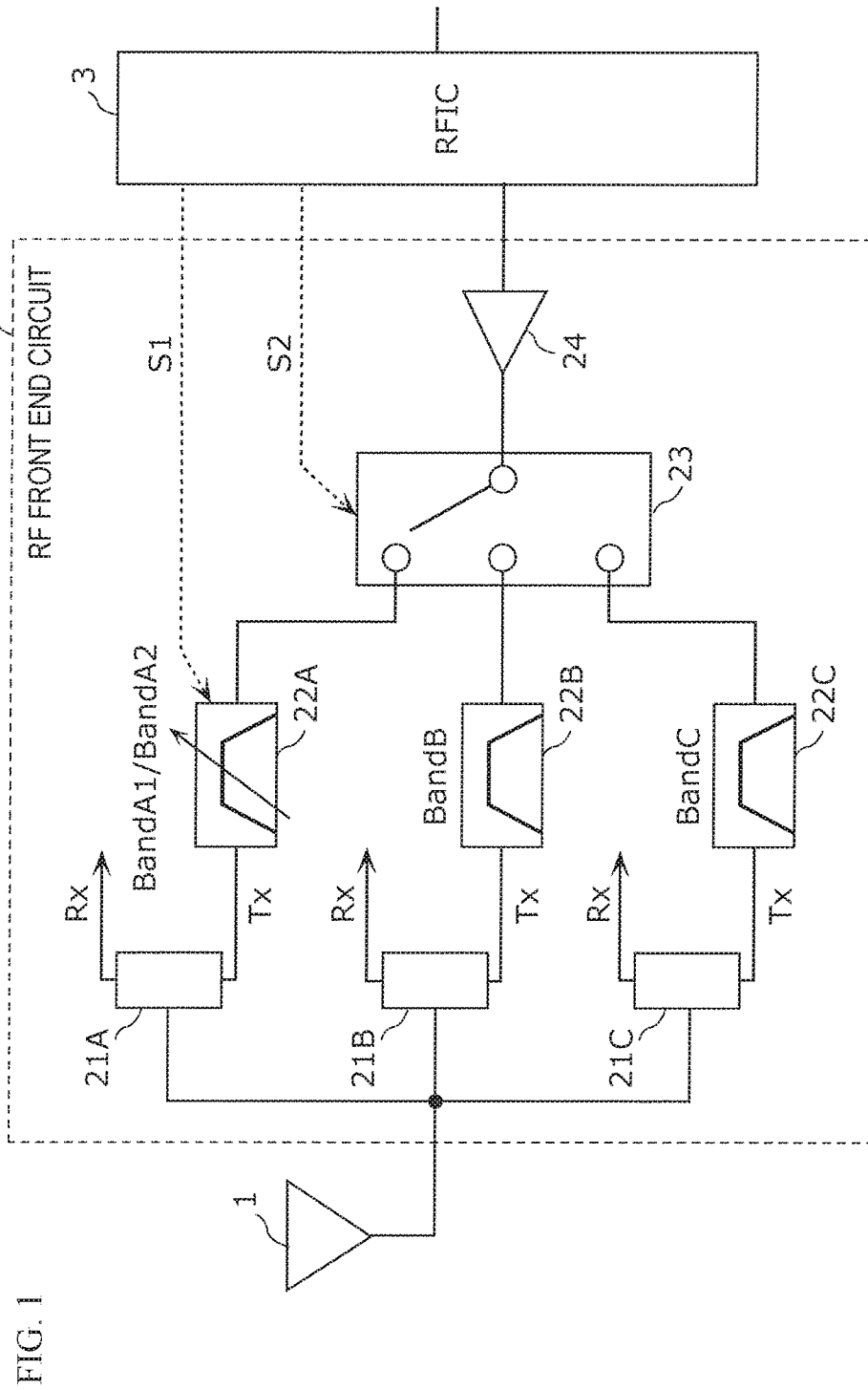
FIG. 1 is a circuit configuration diagram of a communication apparatus according to a first embodiment.

Hereinafter, embodiments of the present disclosure will be described in detail with reference to examples and drawings. The embodiments described herein illustrate either general or specific examples. Numerical values, shapes, materials, components, and arrangement and modes of connection of the components described in the embodiments are merely examples, and are not intended to limit the present disclosure. Components in the embodiments, except those described in the independent claims, will be explained as optional components. The sizes or the ratios between the sizes of the components illustrated in the drawings are not strictly correct.

First Embodiment

[1.1 Configuration of RF Front End Circuit]

FIG. 1 is a circuit configuration diagram of a communication apparatus according to a first embodiment. In FIG. 1, an antenna element 1, an RF front end circuit 2, and an RF signal processing circuit (RFIC) 3 are illustrated. The antenna element 1, the RF front end circuit 2 and the RFIC 3 are arranged in, for example, a front end unit of a cellular phone that supports multiple modes/multiple bands.

For example, the RFIC 3 performs signal processing, by upconversion or the like, on a baseband transmission signal input from a baseband signal processing circuit (not illustrated in FIG. 1), and outputs a radio frequency transmission signal, which is generated by the signal processing, to the RF front end circuit 2. Furthermore, the RFIC 3 functions as a controller that controls, based on a frequency band used, electrical connection and electrical non-connection of each switch included the RF front end circuit 2.

The RF front end circuit 2 includes switches 21A, 21B, 21C, and 23, a radio frequency filter circuit 22A, radio frequency filters 22B and 22C, and a power amplifier 24. Accordingly, the RF front end circuit 2 includes a plurality of signal paths through which radio frequency signals of specific frequency bands can pass in a selective manner. Specifically, a radio frequency transmission signal of a frequency band (band) A1 or a frequency band (band) A2 is output to the antenna element 1 through a signal path passing through the power amplifier 24, the switch 23, the radio frequency filter circuit 22A, and the switch 21A. Furthermore, a radio frequency transmission signal of a band B is output to the antenna element 1 through a signal path passing through the power amplifier 24, the switch 23, the radio frequency filter 22B, and the switch 21B. Furthermore, a radio frequency transmission signal of a band C is output to the antenna element 1 through a signal path passing through the power amplifier 24, the switch 23, the radio frequency filter 22C, and the switch 21C.

The radio frequency filter circuit 22A is a principal configuration of the present disclosure and is a filter element in which switching between transmission characteristics for transmitting a radio frequency transmission signal of the band A1 and transmission characteristics for transmitting a radio frequency transmission signal of the band A2 is performed based on a control signal S1 for selecting a frequency band.

The radio frequency filter 22B is a filter element that has transmission characteristics for transmitting a radio frequency transmission signal of the band B.

The radio frequency filter 22C is a filter element that has transmission characteristics for transmitting a radio frequency transmission signal of the band C.

The switch 23 is a switch of an SP3T (Single Pole Triple Throw) type and is a switch element by which connection is switched based on a control signal S2 for selecting a frequency band. The switch 23 may be a switch of an SPnT (Single Pole n Throw) type in which the number n of selection terminals is set according to the number of set bands.

In FIG. 1, detailed illustration of reception signal paths is omitted. A radio frequency reception signal from the antenna element 1 passes through each reception signal path included in the RF front end circuit 2 and is output to the RFIC 3. Specifically, a radio frequency reception signal of the band A1 or the band A2 is output to the RFIC 3 through a signal path passing through the antenna element 1, the switch 21A, a reception-side filter circuit (not illustrated in FIG. 1), and a low noise amplifier (not illustrated in FIG. 1). Furthermore, a radio frequency reception signal of the band B is output to the RFIC 3 through a signal path passing through the antenna element 1, the switch 21B, a reception-side filter circuit (not illustrated in FIG. 1), and a low noise amplifier (not illustrated in FIG. 1). Furthermore, a radio frequency reception signal of the band C is output to the RFIC 3 through a signal path passing through the antenna element 1, the switch 21C, a reception-side filter circuit (not illustrated in FIG. 1), and a low noise amplifier (not illustrated in FIG. 1).

Furthermore, in FIG. 1, the power amplifier 24 amplifies radio frequency signals of all bands. However, power amplifiers corresponding to individual bands may be arranged.

Furthermore, in FIG. 1, the switches 21A to 21C are arranged on the assumption of a time division duplex (TDD) system as devices for switching between a transmission path (Tx) and a reception path (Rx). However, the present disclosure is not limited to this. For example, in the case where a duplexer including the radio frequency filter 22B through which a radio frequency transmission signal of the band B can pass in a selective manner and a radio frequency filter circuit through which a radio frequency reception signal of the band B can pass in a selective manner is arranged on the assumption of a frequency division duplex (FDD) system, the switch 21B is not necessary in a stage previous to the duplexer. The same applies to the band A1/A2 and the band C.

Furthermore, in the case of the time division duplex (TDD) system, the switches 21A, 21B, and 21C are not necessarily arranged between the radio frequency filters 22A, 22B, and 22C, respectively, and the antenna element. The switches 21A, 21B, and 21C may be arranged after the radio frequency filters 22A, 22B, and 22C, respectively, and the power amplifier 24 or switches may be arranged in both a previous stage and a subsequent stage of the radio frequency filters 22A, 22B, and 22C.

With the above configuration, the RF front end circuit 2 functions as a radio frequency front end circuit for wireless communication that is capable of selecting at least one of signal paths of the band A1/A2, the band B, and the band C, based on the control signals S1 and S2 from the RFIC 3, and transmitting a radio frequency signal using the selected signal path with a low loss.

[1.2 Configuration of Radio Frequency Filter Circuit]

In a system that supports multiple modes/multiple bands, exclusive selection and using between two or more bands whose frequency bands are adjacent to each other or partially overlap may be performed. In the RF front end circuit 2 illustrated in FIG. 1, these bands correspond to the band A1 and band A2. Hereinafter, the relationship of the band A1 and band A2 and required transmission characteristics will be explained.

Figure 2:
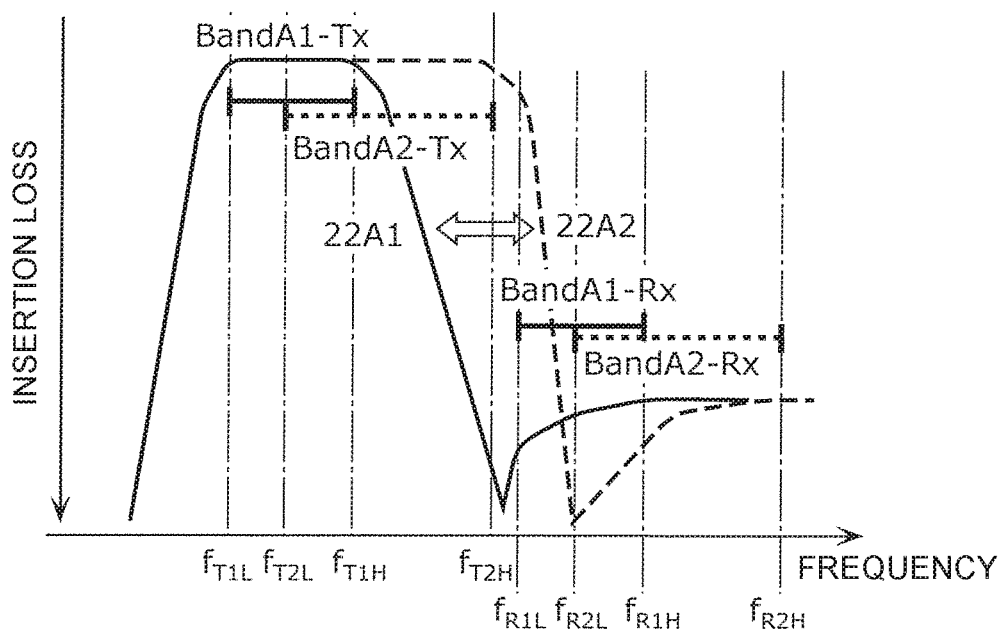
FIG. 2 is a diagram for explaining the relationship of transmission characteristics and frequency allocation of a radio frequency filter circuit according to the first embodiment.

FIG. 2 is a diagram for explaining the relationship of transmission characteristics and frequency allocation of the radio frequency filter circuit 22A according to the first embodiment. As illustrated in FIG. 2, the transmission band of the band A1 ranges from $f_{T1L}$ to $f_{T1H}$, and the transmission band of the band A2 ranges from $f_{T2L}$ to $f_{T2H}$. Here, the transmission band of the band A1 and the transmission band of the band A2 overlap in the range from $f_{T2L}$ to $f_{T1H}$. Furthermore, the higher frequency end $f_{T2H}$ of the transmission band of the band A2 is higher than the higher frequency end $f_{T1H}$ of the transmission band of the band A1. In contrast, the reception band of the band A1 ranges from $f_{R1L}$ to $f_{R1H}$, and the reception band of the band A2 ranges from $f_{R2L}$ to $f_{R2H}$. Here, the reception band of the band A1 and the reception band of the band A2 overlap in the range from $f_{R2L}$ to $f_{R1H}$. Furthermore, the frequency interval between the higher frequency end $f_{T2H}$ of the transmission band of the band A2 and the lower frequency end $f_{R1L}$ of the reception band of the band A1 is extremely small or the higher frequency end $f_{T2H}$ and the lower frequency end $f_{R1L}$ overlap. With the above-mentioned frequency allocation, exclusive selection and using between the band A1 and the band A2 is performed.

In the case where a transmission-side filter is configured based on frequency specifications of the band A1 and the band A2 as described above, in order to ensure low-loss characteristics of each transmission band and an attenuation of each reception band, the transmission characteristics illustrated in FIG. 2 are required. That is, characteristics represented by a solid line in FIG. 2 are required as transmission characteristics of a transmission-side filter of the band A1, and characteristics represented by a broken line in FIG. 2 are required as transmission characteristics of a transmission-side filter of the band A2. Specifically, with respect to transmission characteristics within a band of the transmission-side filter of the band A2, a higher frequency side of the transmission characteristics within a band of the transmission-side filter of the band A1 needs to be shifted toward a lower frequency side so that a band width can be narrowed.

In terms of the filter requirement characteristics as described above, the radio frequency filter circuit 22A according to this embodiment is implemented with a simple and compact configuration by switching between transmission characteristics 22A1 (second frequency band) required for the band A1 and transmission characteristics 22A2 (first frequency band) required for the band A2.

Here, regarding two bands, a state in which "frequency bands are adjacent to each other or partially overlap" is not limited to the case where pass bands partially overlap, as with the band A1 and the band A2 illustrated in FIG. 2. Even if two bands are separated from each other, for example, a case where there is a frequency relationship such that the frequency interval between the two bands is within a several percent of the center frequency of the two bands (average frequency of the center frequency of each of the two bands) is also included.

Figure 3:
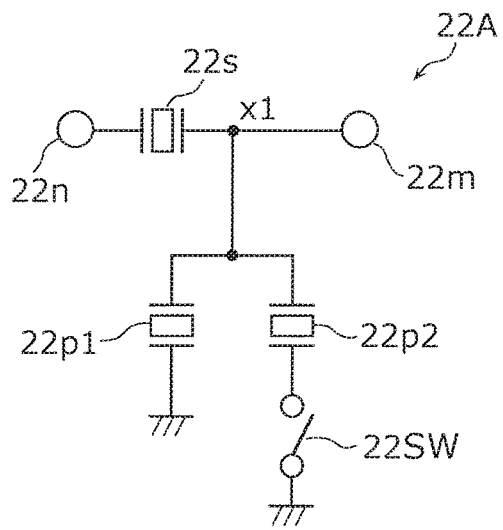
FIG. 3 is a circuit configuration diagram illustrating an example of the radio frequency filter circuit according to the first embodiment.

FIG. 3 is a circuit configuration diagram of the radio frequency filter circuit 22A according to the first embodiment. The radio frequency filter circuit 22A illustrated in FIG. 3 includes a series-arm resonator 22s, parallel-arm resonators 22p1 and 22p2, a switch 22SW, an input terminal 22m, and an output terminal 22n.

The series-arm resonator 22s is connected between the input terminal 22m and the output terminal 22n.

The parallel-arm resonator 22p1 is a first parallel-arm resonator that is connected between a node x1 on a path connecting the input terminal 22m, the series-arm resonator 22s, and the output terminal 22n and a ground (reference) terminal.

The parallel-arm resonator 22p2 is a second parallel-arm resonator that is connected between the node x1 and a ground terminal.

The switch 22SW is a switch element that is arranged between the node x1 and the ground terminal and switches between electrical connection and electrical non-connection of a path connecting the node x1, the parallel-arm resonator 22p2, and the ground terminal. In this embodiment, the switch 22SW is connected to the parallel-arm resonator 22p2 and the ground terminal.

Here, a resonant frequency of the parallel-arm resonator 22p2 is higher than a resonant frequency of the parallel-arm resonator 22p1. Furthermore, the resonant frequency of the parallel-arm resonator 22p2 is higher than a resonant frequency of the series-arm resonator 22s and lower than an anti-resonant frequency of the series-arm resonator 22s.

That is, in the radio frequency filter circuit 22A according to this embodiment, the parallel-arm resonator 22p1, out of the series-arm resonator 22s and the parallel-arm resonator 22p1 that form a ladder filter, and a circuit in which the parallel-arm resonator 22p2 for varying a frequency and the switch 22SW are connected in series are connected in parallel between the node x1 and the ground terminal.

Furthermore, the switch 22SW may be, for example, an FET (Field Effect Transistor) switch formed of GaAs or a CMOS (Complementary Metal Oxide Semiconductor) or a diode switch. Accordingly, the switch 22SW may be configured of an FET switch or a diode switch, and therefore, the radio frequency filter circuit 22A of a small size can be achieved.

In this embodiment, the series-arm resonator 22s and the parallel-arm resonators 22p1 and 22p2 are resonators using surface acoustic waves. Accordingly, the radio frequency filter circuit 22A may be configured of an IDT (InterDigital Transducer) electrode formed on a piezoelectric substrate, and therefore, the radio frequency filter circuit 22A of a small size and low profile having high-steepness transmission characteristics can be achieved. Hereinafter, a structure of a surface acoustic wave resonator will be explained.

Figure 4:
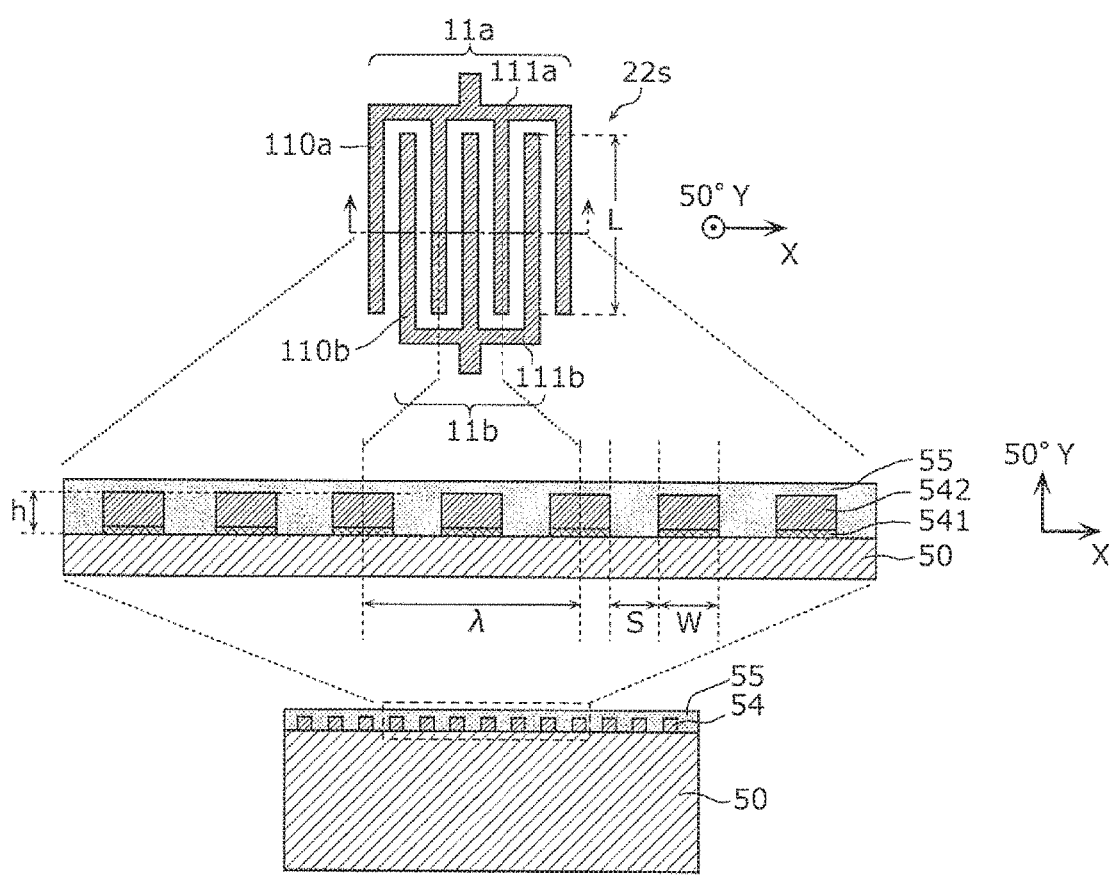
FIG. 4 is an example of a plan view and a cross-sectional view schematically illustrating a resonator of the radio frequency filter circuit according to the first embodiment.

FIG. 4 illustrates an example of a plan view and a cross-sectional view schematically illustrating a resonator of the radio frequency filter circuit 22A according to the first embodiment. In FIG. 4, a plan schematic view and cross-sectional schematic view illustrating a structure of the series-arm resonator 22s, out of the series-arm resonator 22s and the parallel-arm resonators 22p1 and 22p2 that form the radio frequency filter circuit 22A, are illustrated as an example. The series-arm resonator in FIG. 4 is illustrated to explain a typical structure of the plurality resonators, and the number, length, and the like of electrode fingers forming an electrode are not limited to the example illustrated in FIG. 4.

Each resonator of the radio frequency filter circuit 22A includes a piezoelectric substrate 50 and interdigital transducer electrodes 11a and 11b having a comb shape.

As illustrated in the plan view of FIG. 4, the pair of interdigital transducer electrodes 11a and 11b that face each other is formed on the piezoelectric substrate 50. The interdigital transducer electrode 11a includes a plurality of electrode fingers 110a that are parallel to one another and a busbar electrode 111a that connects the plurality of electrode fingers 110a. The interdigital transducer electrode 11b includes a plurality of electrode fingers 110b that are parallel to one another and a busbar electrode 111b that connects the plurality of electrode fingers 110b. The plurality of electrode fingers 110a and 110b are formed along a direction that is orthogonal to an X-axis direction.

Furthermore, an interdigital transducer electrode 54 that includes the plurality of electrode fingers 110a and 110b and the busbar electrodes 111a and 111b has a multilayer structure including a close contact layer 541 and a main electrode layer 542, as illustrated in the cross-sectional view of FIG. 4.

The close contact layer 541 is a layer to improve close contactness between the piezoelectric substrate 50 and the main electrode layer 542. For example, Ti is used as a material of the close contact layer 541. The film thickness of the close contact layer 541 is, for example, 12 nm.

For example, Al containing 1% of Cu is used as a material of the main electrode layer 542. The film thickness of the main electrode layer 542 is, for example, 162 nm.

A protection layer 55 is formed to cover the interdigital transducer electrodes 11a and 11b. The protection layer 55 is a layer whose purpose is to, for example, protect the main electrode layer 542 from external environment, adjust frequency-temperature characteristics, and increase humidity resistance. The protection layer 55 is a film containing silicon dioxide as a main component.

The structure of each resonator included in the radio frequency filter circuit 22A according to the present disclosure is not limited to the structure described in FIG. 4. For example, the interdigital transducer electrode 54 may include a single layer of a metal film, instead of a multilayer structure including metal films.

Furthermore, materials forming the close contact layer 541, the main electrode layer 542, and the protection layer 55 are not limited to the materials described above. Furthermore, the interdigital transducer electrode 54 may not have the multilayer structure described above. For example, the interdigital transducer electrode 54 may be formed of metal such as Ti, Al, Cu, Pt, Au, Ag, Pd, or NiCr or an alloy thereof or may be formed of a plurality of multilayer bodies formed of the metal or alloy mentioned above. Furthermore, the protection layer 55 may not be formed.

The piezoelectric substrate 50 is formed of, for example, 50° Y-cut, X-propagation LiTaO$_3$ piezoelectric monocrystal or piezoelectric ceramics (lithium tantalate monocrystal which is cut along a plane whose normal is defined by an axis that is rotated around an X axis as a central axis by 50 degrees from a Y axis or ceramics and through which surface acoustic waves propagate in the X-axis direction). In this embodiment, 50° Y-cut, X-propagation LiTaO$_3$ monocrystal is illustrated as an example of the piezoelectric substrate 50. However, a monocrystal material forming the piezoelectric substrate 50 is not limited to LiTaO$_3$, and Cut-Angles of the monocrystal material are not limited to the example mentioned above.

Hereinafter, design parameters of an interdigital transducer electrode will be explained. The wave length λ of a surface acoustic wave resonator is defined as twice the pitch of the plurality of electrode fingers 110a and 110b forming the interdigital transducer electrodes 11a and 11b illustrated in a middle part of FIG. 4. Furthermore, the cross-width L of the interdigital transducer electrode is equal to the overlapping electrode finger length of the electrode fingers 110a of the interdigital transducer electrode 11a and the electrode fingers 110b of the interdigital transducer electrode 11b when viewed from the X-axis direction, as illustrated in an upper part of FIG. 4. Furthermore, the number of pairs is expressed by (Mp−1)/2 when the total number of electrode fingers 110a and 110b is represented by Mp. The wave length λ, the cross-width L, and the number of pairs of the series-arm resonator 22s and the parallel-arm resonators 22p1 and 22p2 are determined in accordance with specifications required for the pass band of the band A1 and the band A2.

In terms of miniaturization of the radio frequency filter circuit 22A, it is desirable that the series-arm resonator 22s and the parallel-arm resonators 22p1 and 22p2 be formed on the one piezoelectric substrate 50. However, the series-arm resonator 22s and the parallel-arm resonators 22p1 and 22p2 may be formed on different substrates.

Furthermore, the series-arm resonator 22s and the parallel-arm resonators 22p1 and 22p2 may not be surface acoustic wave resonators and may be resonators using BAW (Bulk Acoustic Waves). Accordingly, the radio frequency filter circuit 22A may be configured of piezoelectric elements using acoustic waves, and therefore, a compact radio frequency filter circuit having high-steepness transmission characteristics can be achieved.

[1.3 Transmission Characteristics of Radio Frequency Filter Circuit]

Figure 5A:
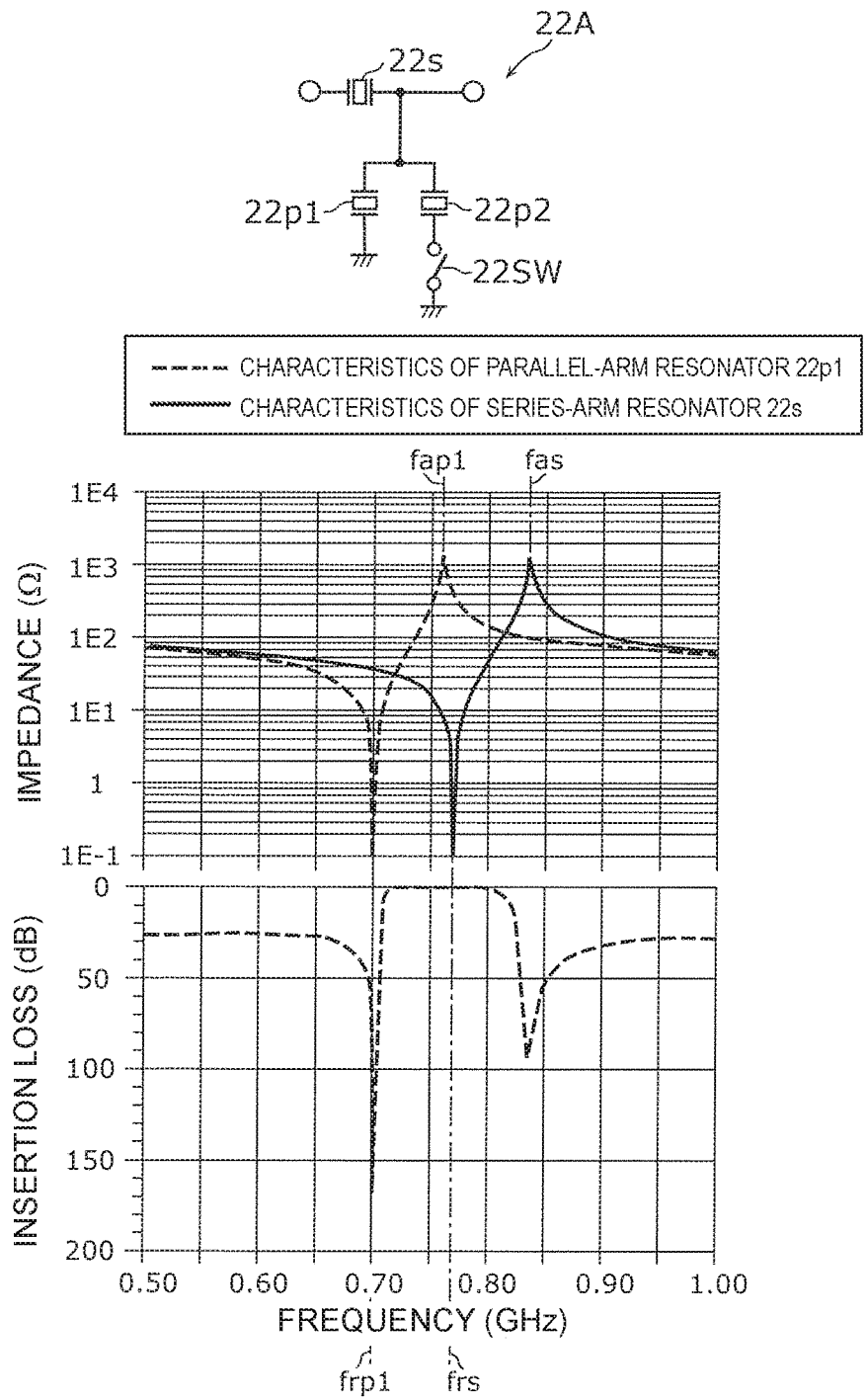
FIG. 5A is a graph illustrating impedance characteristics and transmission characteristics in the case where a switch of the radio frequency filter circuit according to the first embodiment is off.
Figure 5B:
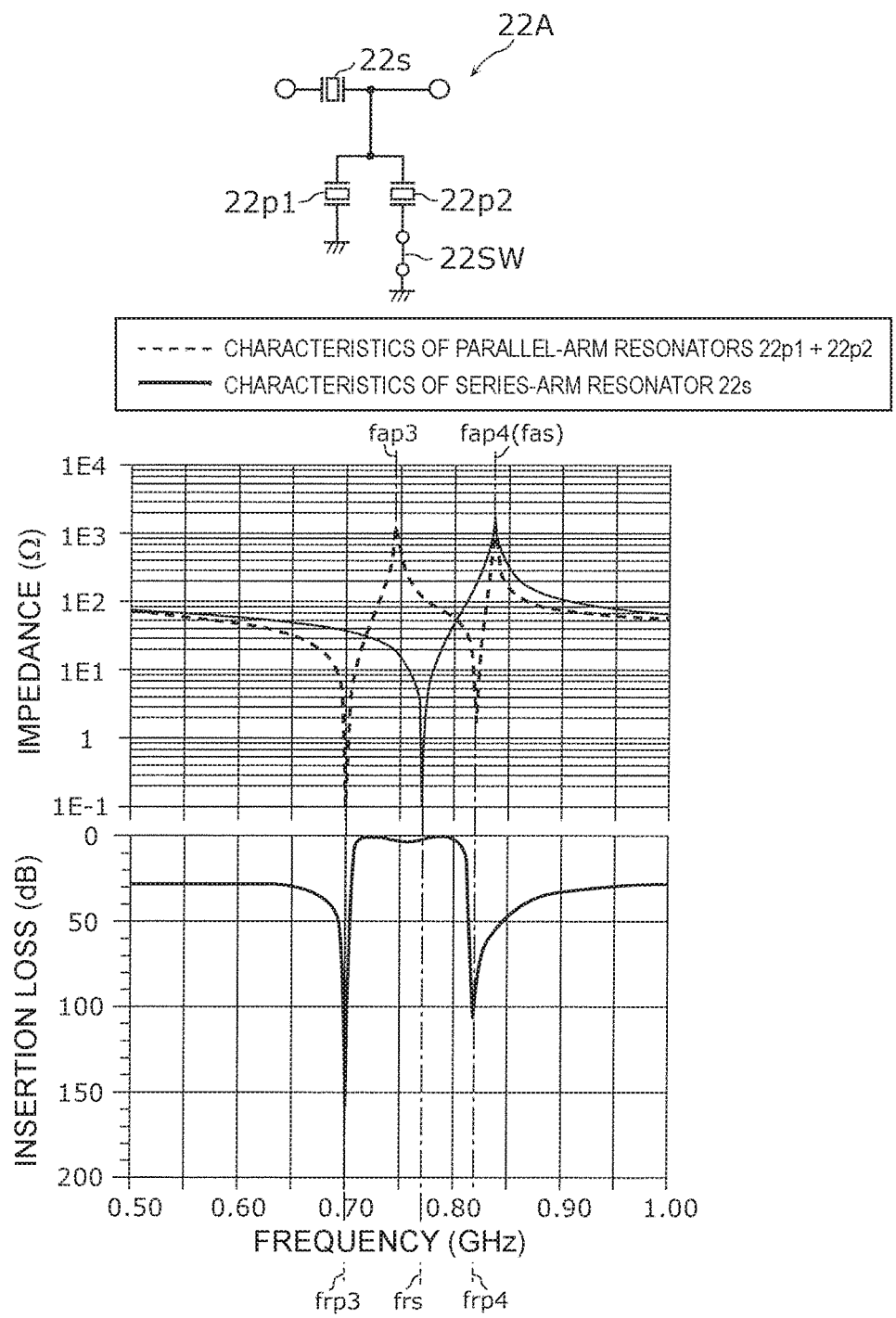
Figure 5C:
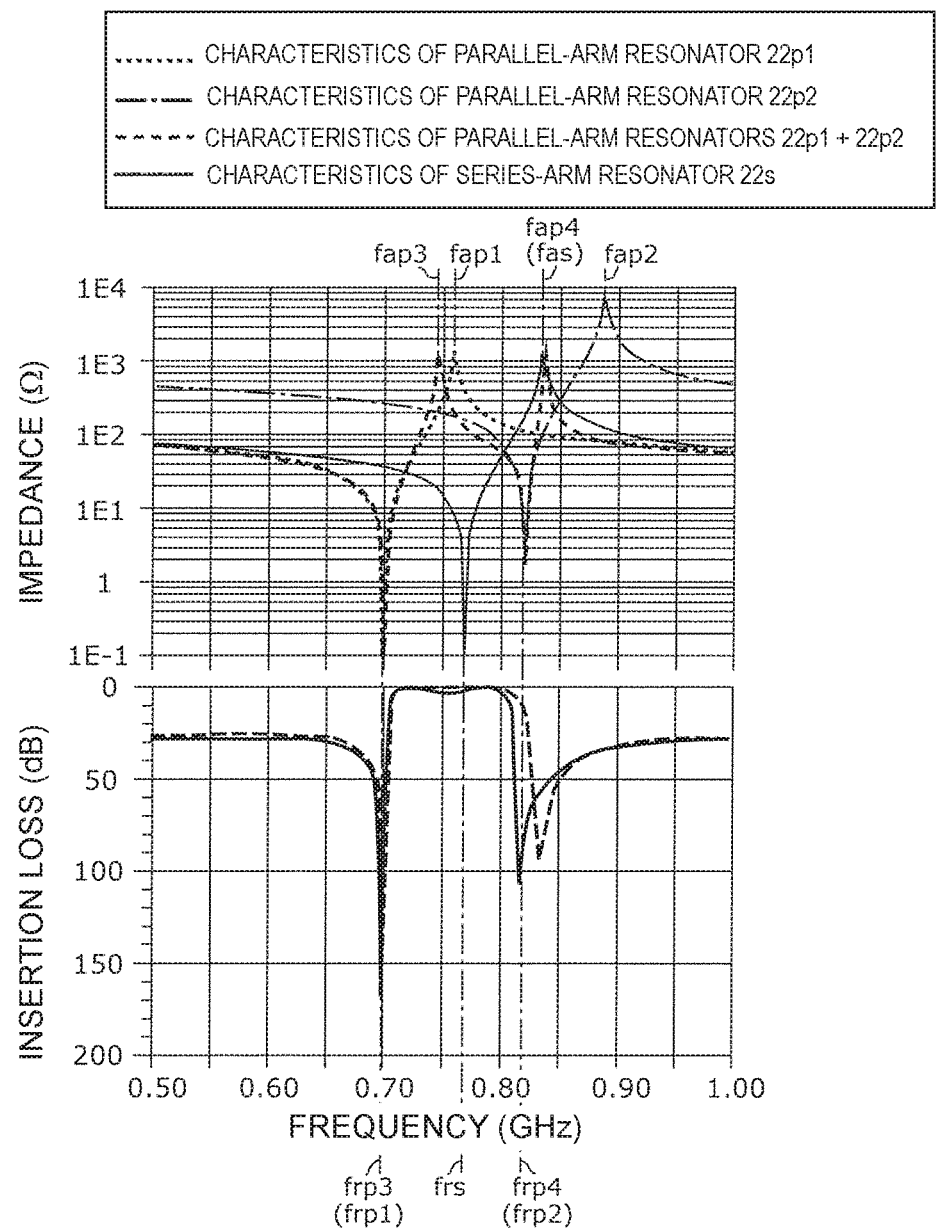

FIG. 5A is a graph illustrating impedance characteristics and transmission characteristics in the case where the switch 22SW of the radio frequency filter circuit 22A according to the first embodiment is off (electrically non-connected). FIG. 5B is a graph illustrating impedance characteristics and transmission characteristics in the case where the switch 22SW of the radio frequency filter circuit 22A according to the first embodiment is on (electrically connected). Furthermore, FIG. 5C is a graph illustrating a comparison of impedance characteristics and transmission characteristics between the case where the switch 22SW of the radio frequency filter circuit 22A according to the first embodiment is off and the case where the switch 22SW is on.

The radio frequency filter circuit 22A according to this embodiment has a ladder filter structure of one stage including the series-arm resonator 22s, the parallel-arm resonator 22p1, and the parallel-arm resonator 22p2. In the case where the switch 22SW is in an off state, the parallel-arm resonator 22p2 does not function, and therefore, a ladder filter structure of one stage including the series-arm resonator 22s and the parallel-arm resonator 22p1 is formed. FIG. 5A illustrates impedance characteristics and transmission characteristics of a ladder-type surface acoustic wave filter in the case where the switch 22SW is in the off state.

First, operation principles of a ladder-type surface acoustic wave filter including the series-arm resonator 22s and the parallel-arm resonator 22p1 will be explained with reference to FIG. 5A.

The parallel-arm resonator 22p1 illustrated in FIG. 5A has a resonant frequency frp1 and an anti-resonant frequency fap1 (>frp1). The series-arm resonator 22s has a resonant frequency frs and an anti-resonant frequency fas (>frs>frp1). To configure a band pass filter including a ladder-type resonator, the anti-resonant frequency fap1 of the parallel-arm resonator 22p1 and the resonant frequency frs of the series-arm resonator 22s are brought close to each other. Accordingly, a region near the resonant frequency frp1 where the impedance of the parallel-arm resonator 22p1 approaches 0 is defined as a stopband region on a lower frequency side. Then, as the frequency increases, the impedance of the parallel-arm resonator 22p1 increases to high value in a region near the anti-resonant frequency fap1 and the impedance of the series-arm resonator 22s approaches 0 in a region near the resonant frequency frs. Thus, in a region near a range from the anti-resonant frequency fap1 to the resonant frequency frs, a signal pass region is obtained in a signal path from the input terminal 22m to the output terminal 22n. Furthermore, as the frequency increases to a region near the anti-resonant frequency fas, the impedance of the series-arm resonator 22s increases, and a stopband region on a higher frequency side is obtained.

In the radio frequency filter circuit 22A in FIG. 5A, when a radio frequency signal is input from the input terminal 22m, a potential difference occurs between the input terminal 22m and the ground terminal. Thus, the piezoelectric substrate 50 is distorted, and therefore, surface acoustic waves propagating in the X direction are generated. By making the wave length λ of the interdigital transducer electrode of the series-arm resonator 22s to correspond to the wave length of the resonant frequency frs and making the wave length λ of the interdigital transducer electrode of the parallel-arm resonator 22p1 correspond to the wave length of the resonant frequency frp1, only a radio frequency signal containing a frequency component that is desired to be transmitted can pass through the radio frequency filter circuit 22A.

In contrast, FIG. 5B illustrates impedance characteristics and transmission characteristics of a ladder-type surface acoustic wave filter in the case where the switch 22SW is in an on state. When the switch 22SW enters the on state, the parallel resonant circuit of the ladder-type acoustic wave filter forms a configuration in which the parallel-arm resonators 22p1 and 22p2 are connected in parallel. Accordingly, resonant points of the parallel resonant circuit in which the parallel-arm resonators 22p1 and 22p2 are connected in parallel are two points: resonant frequencies frp3 and frp4 in order from a lower frequency side (an upper graph in FIG. 5B). The resonant frequency frp3 is a resonant point that reflects resonance characteristics of the parallel-arm resonator 22p1 and corresponds to an attenuation pole formed on a lower frequency side of the pass band of the ladder filter of one stage including the series-arm resonator 22s and the parallel-arm resonator 22p1. The resonant frequency frp4 is a resonant point that reflects resonance characteristics of the parallel-arm resonator 22p2 and corresponds to an attenuation pole formed on a higher frequency side of the pass band in the above-mentioned ladder filter structure. The resonant frequency frp2 of the parallel-arm resonator 22p2 (reflected in the resonant frequency frp4 of the parallel resonant circuit) is set higher than the resonant frequency frp1 of the parallel-arm resonator 22p1 (reflected in the resonant frequency frp3 of the parallel resonant circuit). Furthermore, the resonant frequency frp2 of the parallel-arm resonator 22p2 is set higher than the resonant frequency frs of the series-arm resonator 22s and lower than the anti-resonant frequency fas of the series-arm resonator 22s.

Anti-resonant points of the parallel resonant circuit in which the parallel-arm resonators 22p1 and 22p2 are connected in parallel are two points: anti-resonant frequencies fap3 and fap4 in order from a lower frequency side (upper graph in FIG. 5B). The anti-resonant frequency fap3 is an anti-resonant point at a lower frequency, out of the anti-resonant frequencies fap3 and fap4, and exists within the pass band of the ladder filter of one stage including the series-arm resonator 22s and the parallel-arm resonator 22p1. Furthermore, the anti-resonant frequency fap4 is an anti-resonant point at a higher frequency, out of the anti-resonant frequencies fap3 and fap4, and is higher than the pass band of the above-mentioned ladder filter structure. The anti-resonant frequency fap3 of the parallel resonant circuit including the parallel-arm resonators 22p1 and 22p2 is lower than the anti-resonant frequency fap1 of the parallel-arm resonator 22p1, and the anti-resonant frequency fap4 of the parallel resonant circuit is lower than the anti-resonant frequency fap2 of the parallel-arm resonator 22p2.

Hereinafter, resonance characteristics of a resonator will be explained by using an equivalent circuit model. First, resonance characteristics of the parallel-arm resonant circuit in the case where the switch 22SW is in the off state illustrated in FIG. 5A will be explained.

Figure 6A:
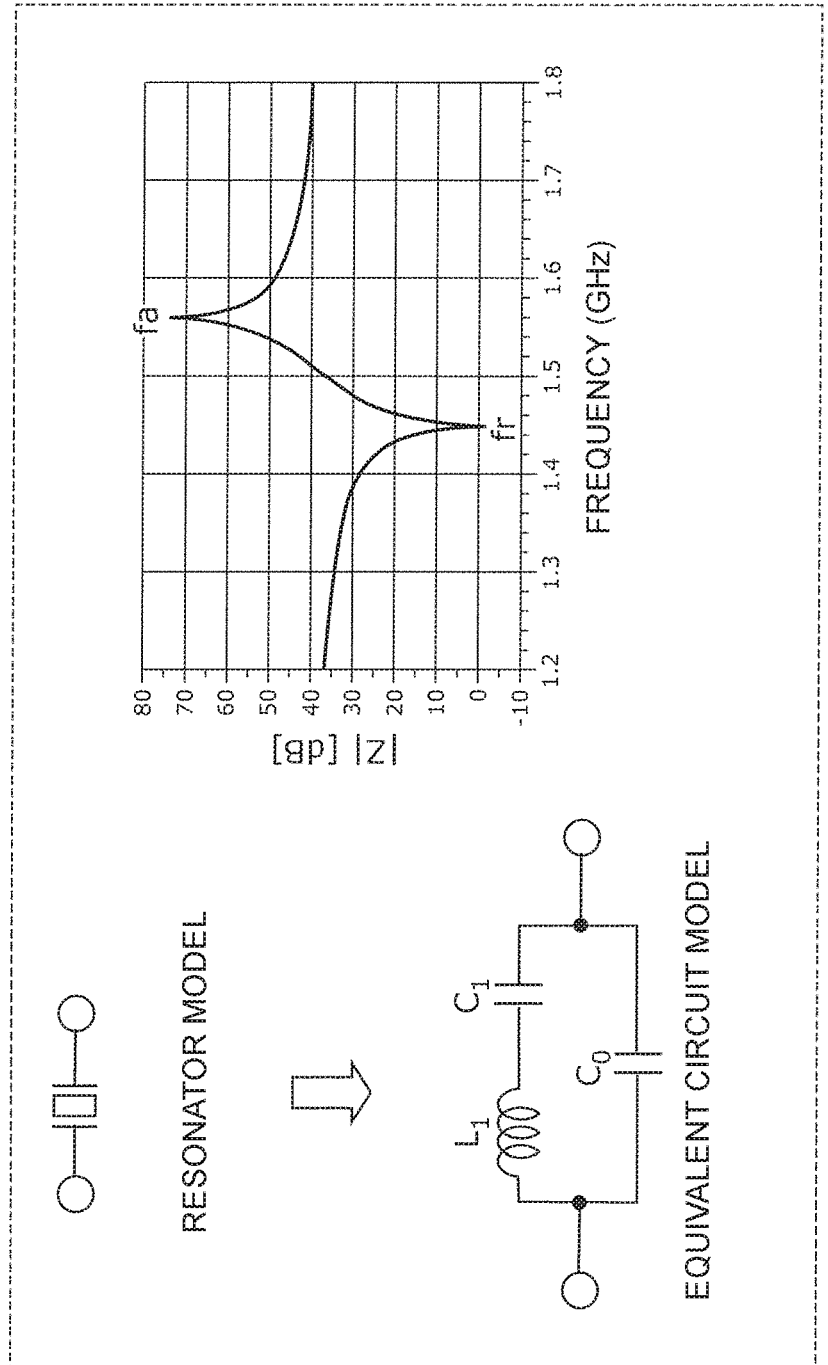
FIG. 6A is a diagram illustrating an equivalent circuit model of a resonator and resonance characteristics of the resonator.

FIG. 6A is a diagram illustrating an equivalent circuit model of a resonator and resonance characteristics of the resonator. As illustrated in FIG. 6A, a resonator may be represented by a parallel circuit including a capacitor $C_0$ and a series circuit including a capacitor $C_1$ and an inductor $L_1$. The capacitor $C_0$ represents an electrostatic capacitance of the resonator.

In the equivalent circuit, a resonant frequency fr of the resonator is defined by a series circuit including the capacitor $C_1$ and the inductor $L_1$ and is represented by Equation 1.

[Math. 1]

$$f_r = \frac{1}{2\pi\sqrt{L_1 C_1}} \qquad \text{(Equation 1)}$$

Furthermore, an anti-resonant frequency fa of the resonator is a frequency at which an admittance Y of the equivalent circuit is 0, and therefore, the anti-resonant frequency fa may be represented by Equation 3 by solving Equation 2.

[Math. 2]

$$Y = \frac{1}{Z} = 0 = \frac{1}{\frac{1}{j\omega C_0}} + \frac{1}{j\omega L_1 + \frac{1}{j\omega C_1}} \qquad \text{(Equation 2)}$$

[Math. 3]

$$f_a = \frac{\sqrt{1 + \frac{C_1}{C_0}}}{2\pi\sqrt{L_1 C_1}} = f_r\sqrt{1 + \frac{C_1}{C_0}} \qquad \text{(Equation 3)}$$

According to Equation 1 and Equation 3, the anti-resonant frequency fa appears on a higher frequency side relative to the resonant frequency fr, as illustrated in a right graph of FIG. 6A.

That is, it is shown that the parallel-arm resonant circuit for the case where the switch 22SW is in the off state illustrated in FIG. 5A has only resonance characteristics of the parallel-arm resonator 22p1 and has a resonant point and an anti-resonant point that exists on a higher frequency side relative to the resonant point appear.

Next, resonance characteristics of the parallel-arm resonant circuit for the case where the switch 22SW is in the on state illustrated in FIG. 5B will be explained.

Figure 6B:
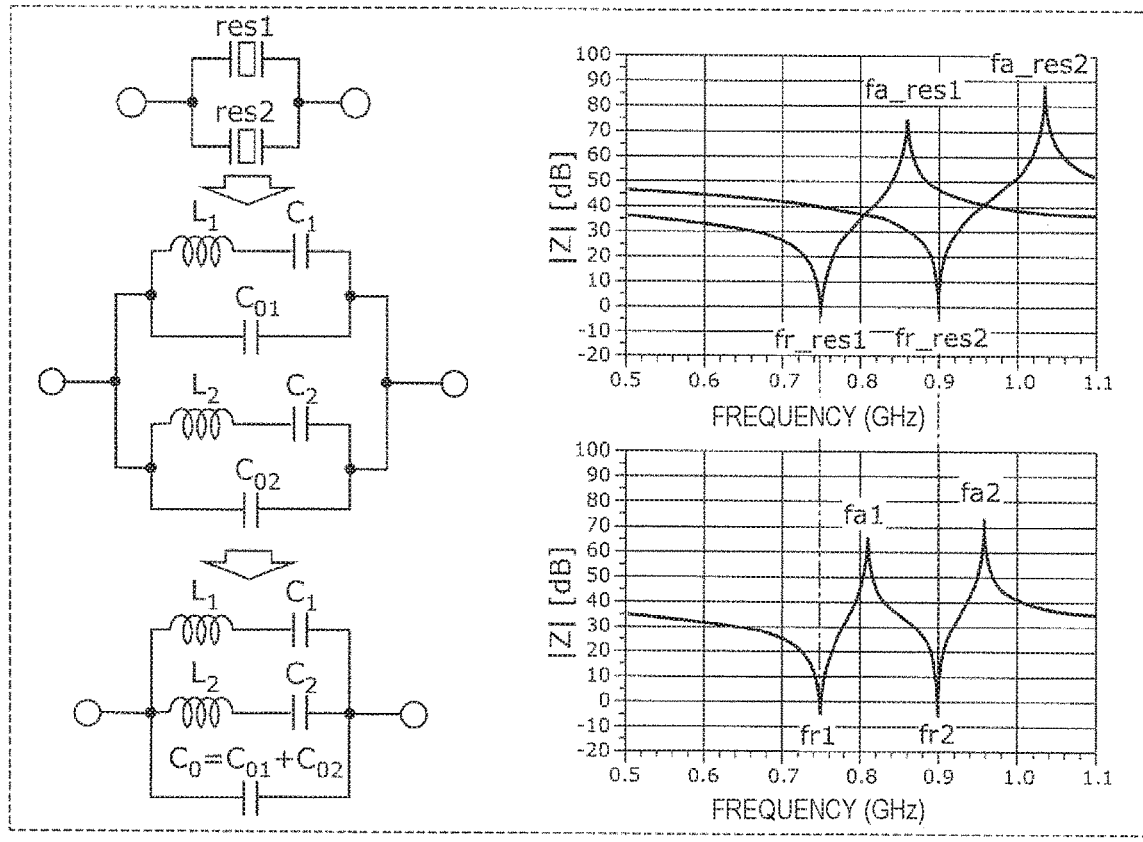
FIG. 6B is a diagram illustrating an equivalent circuit model of two resonators that are connected in parallel and resonance characteristics of the two resonators.

FIG. 6B is a diagram illustrating an equivalent circuit model of two resonators that are connected in parallel and resonance characteristics of the resonators. In FIG. 6B, a model in which resonators res1 and res2 are connected in parallel is illustrated. The resonator res1 may be represented by a parallel circuit including a capacitor $C_{01}$ and a series circuit including a capacitor $C_1$ and an inductor $L_1$, and the resonator res2 may be represented by a parallel circuit including a capacitor $C_{02}$ and a series circuit including a capacitor $C_2$ and an inductor $L_2$. The capacitors $C_{01}$ and $C_{02}$ represent electrostatic capacitances of the resonators res1 and res2. The resonant circuit including the two resonators res1 and res2 may be represented by an equivalent circuit illustrated in a lower left part of FIG. 6B. That is, the resonant circuit may be represented by a parallel circuit including a series circuit including the capacitor $C_1$ and the inductor $L_1$, a series circuit including the capacitor $C_2$ and the inductor $L_2$, and the capacitor $C_0$ (=$C_{01}$+$C_{02}$).

In the above equivalent circuit, the resonant frequency fr of the resonator is defined by a series circuit including the capacitor $C_1$ and the inductor $L_1$ and is represented by Equation 1.

In the equivalent circuit, the two resonant points are defined, the resonant frequencies fr1 and fr2 are defined by the series circuit including the capacitor $C_1$ and the inductor $L_1$ and the series circuit including the capacitor $C_2$ and the inductor $L_2$, respectively, and are represented by Equation 4.

[Math. 4]

$$f_r1 = \frac{1}{2\pi\sqrt{L_1 C_1}} \quad f_r2 = \frac{1}{2\pi\sqrt{L_2 C_2}} \quad \text{(Equation 4)}$$

That is, the two resonant points fr1 and fr2 represented by the equivalent circuit are substantially equal to a resonant point fr_res1 of the resonator res1 and a resonant point fr_res2 of the resonator res2, respectively.

Furthermore, an anti-resonant point in the equivalent circuit is a frequency at which the admittance Y of the equivalent circuit is 0, and therefore, it is shown that two anti-resonant frequencies (fa1 and fa2) are obtained as represented by Equation 6, by solving Equation 5.

[Math. 5]

$$Y = \frac{1}{Z} = 0 = j\omega C_0 + \frac{1}{j\omega L_1 + \frac{1}{j\omega C_1}} + \frac{1}{j\omega L_2 + \frac{1}{j\omega C_2}} \quad \text{(Equation 5)}$$

[Math. 6]

$$f_a = \frac{\sqrt{\frac{-b \pm \sqrt{b^2 - 4ac}}{2a}}}{2\pi} \quad \text{(Equation 6)}$$

$$a = L_1 L_2 C_0 C_1 C_2$$
$$b = -L_1 C_0 C_1 - L_2 C_0 C_2 - L_1 C_1 C_2 - L_2 C_1 C_2$$
$$c = C_0 + C_1 + C_2$$

It is shown that the anti-resonant frequencies fa1 and fa2 obtained by Equation 6 mentioned above are different from anti-resonant frequencies of a resonator alone obtained by Equation 3 (in a graph in FIG. 6B, indicated as fa_res1 and fa_res2). Furthermore, the anti-resonant frequency fa1 derived from Equation 6 is lower than the anti-resonant frequency fa_res1 of the resonator res1 alone, and the anti-resonant frequency fa2 is lower than the anti-resonant frequency fa_res2 of the resonator res2 alone.

Impedance characteristics and transmission characteristics obtained when the switch 22SW of the radio frequency filter circuit 22A is off and those obtained when the switch 22SW is on will be compared with each other in detail with reference to FIG. 5C.

When the switch 22SW is off, the impedance of the parallel-arm resonator 22p2 is substantially infinite, and therefore, the impedance characteristics of the radio frequency filter circuit 22A are impedance characteristics in which impedance characteristics of the series-arm resonator 22s (solid line in an upper graph of FIG. 5C) and impedance characteristics of the parallel-arm resonator 22p1 (thin broken line in the upper graph of FIG. 5C) are combined together. Therefore, the radio frequency filter circuit 22A in the case where the switch 22SW is off serves as a band pass filter (broken line in a lower graph of FIG. 5C) in which the resonant frequency frp1 of the parallel-arm resonator 22p1 is defined as an attenuation pole on a lower frequency side, the anti-resonant frequency fas of the series-arm resonator 22s is defined as an attenuation pole on a higher frequency side, and the anti-resonant frequency fap1 of the parallel-arm resonator 22p1 and the resonant frequency frs of the series-arm resonator 22s form a pass band.

In contrast, when the switch 22SW is on, the impedance characteristics of the radio frequency filter circuit 22A are impedance characteristics in which the impedance characteristics of the series-arm resonator 22s (solid line in the upper graph of FIG. 5C) and the impedance characteristics of the parallel resonant circuit in which the parallel-arm resonators 22p1 and 22p2 are connected in parallel (thick broken line in the upper graph of FIG. 5C) are combined together. The impedance characteristics of the parallel resonant circuit (thick broken line in the upper graph of FIG. 5C) are combined characteristics of the impedance characteristics of the parallel-arm resonator 22p1 (thin broken line in the upper graph of FIG. 5C) and the impedance characteristics of the parallel-arm resonator 22p2 (one-dotted chain line in the upper graph of FIG. 5C). Therefore, the radio frequency filter circuit 22A in the case where the switch 22SW is on serves as a band pass filter (solid line in the lower graph of FIG. 5C) in which the resonant frequency frp3 of the parallel resonant circuit (reflecting the resonant frequency frp1 of the parallel-arm resonator 22p1) is defined as an attenuation pole on a lower frequency side and the resonant frequency frp4 of the parallel resonant circuit (reflecting the resonant frequency frp2 of the parallel-arm resonator 22p2) is defined as an attenuation pole on a higher frequency side.

When the switch 22SW is on, the resonant frequency frp2 of the parallel-arm resonator 22p2 is higher than the resonant frequency frp1 of the parallel-arm resonator 22p1. Therefore, the anti-resonant frequency fap3 of the parallel resonant circuit is shifted lower than the anti-resonant frequency fap1 of the parallel-arm resonator 22p1 and the anti-resonant frequency fap4 of the parallel resonant circuit is shifted lower than the anti-resonant frequency fap2 of the parallel arm resonator 22p2. That is, the anti-resonant frequency fap3 of the parallel resonant circuit is lower than the anti-resonant frequency fap1 of the parallel-arm resonator 22p1 and the resonant frequency frp4 of the parallel resonant circuit is lower than the anti-resonant frequency fas of the series-arm resonator 22s. Therefore, the pass band width in the case where the switch 22SW is on is narrower toward a lower frequency side than that in the case where the switch 22SW is off, and the attenuation band in the case where the switch 22SW is on is shifted toward the lower frequency side relative to the case where the switch 22SW is off.

That is, with the above configuration, the resonant frequency frp2 of the parallel-arm resonator 22p2 is higher than the resonant frequency frs of the series-arm resonator 22s that affects insertion loss near the center frequency in the pass band and is lower than the anti-resonant frequency fas of the series-arm resonator corresponding to the attenuation pole on the higher frequency side outside the pass band. Accordingly, when the switch 22SW is on, the attenuation pole on the higher frequency side outside the pass band may be shifted toward the lower frequency side while low-loss characteristics in the pass band being maintained. Therefore, when the switch 22SW is on, the higher frequency end of the pass band may be shifted toward the lower frequency side, and therefore, the pass band width may be narrowed without necessarily the steepness at the higher frequency end of the pass band being impaired.

A radio frequency filter circuit according to the present disclosure is not limited to a configuration in which the resonant frequency frp2 of the parallel-arm resonator 22p2 is higher than the resonant frequency frs of the series-arm resonator 22s and is lower than the anti-resonant frequency fas of the series-arm resonator 22s. That is, the resonant frequency frp2 of the parallel-arm resonator 22p2 may be higher than the anti-resonant frequency fas of the series-arm resonator 22s. Even in this case, as described above, when the resonant frequency frp2 of the parallel-arm resonator 22p2 is set higher than the resonant frequency frp1 of the parallel-arm resonator 22p1, the impedance at the higher frequency end of the pass band of the parallel resonant circuit is lower than the impedance at the higher frequency end of the pass band of the parallel-arm resonator 22p1. Therefore, the band width of the radio frequency filter circuit 22A in the case where the switch 22SW is on may be made narrower than the band width of the radio frequency filter circuit 22A in the case where the switch 22SW is off.

[1.4 Comparison with Related Art]

Now, the radio frequency filter circuit 22A according to this embodiment will be compared with a known radio frequency filter circuit.

Figure 7:
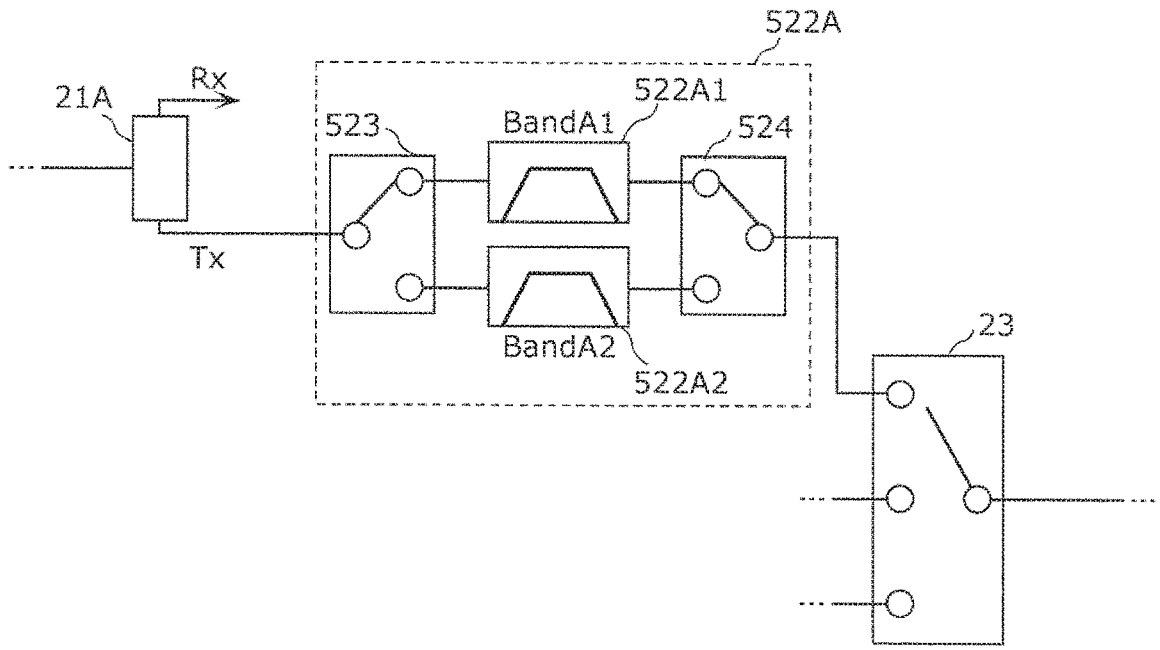
FIG. 7 is a circuit configuration diagram of a radio frequency filter circuit according to a comparative example.

FIG. 7 is a circuit configuration diagram of a radio frequency filter circuit 522A according to a comparative example. The radio frequency filter circuit 522A illustrated in FIG. 7 is a known radio frequency filter circuit and includes a transmission-side filter 522A1 for a band A, a transmission-side filter 522A2 for a band A2, and SPDT-type switches 523 and 524. A feature that a switch 23 is connected so as to precede the radio frequency filter circuit 522A and a switch 21A is connected so as to follow the radio frequency filter circuit 522A is similar to the radio frequency filter circuit 22A according to this embodiment. As illustrated in FIG. 7, in the radio frequency filter circuit 522A according to the comparative example, a circuit for exclusively selecting between two adjacent frequency bands: the band A1 and the band A2, requires two independent filter circuits and two SPDT-type switches. For example, four FET switches are required to form an SPDT-type switch. That is, in the circuit configuration of the radio frequency filter circuit 522A according to the comparative example, two independent filter circuits and eight FET switches are required. Therefore, the circuit configuration is complicated, and the size of the circuit is increased.

In contrast, the radio frequency filter circuit 22A according to this embodiment may be configured of a filter circuit including the series-arm resonator 22s and the parallel-arm resonators 22p1 and 22p2, and the SPST-type switch 22SW, as illustrated in FIG. 3. Therefore, the radio frequency filter circuit may be simplified and miniaturized.

[1.5 Configuration of Radio Frequency Filter Circuit According to First and Second Modifications]

Figure 8A:
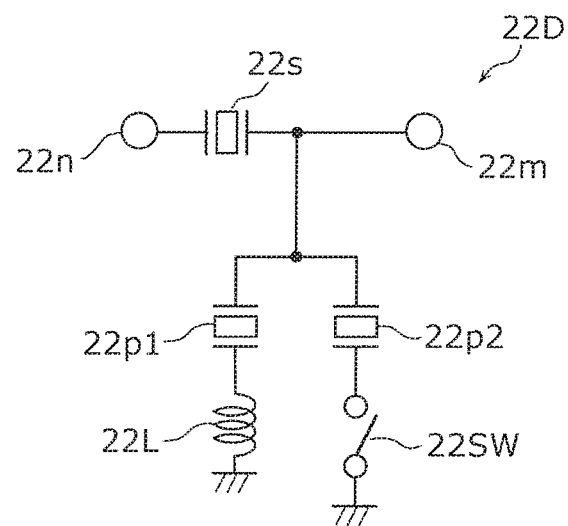
FIG. 8A is a circuit configuration diagram of a radio frequency filter circuit according to a first modification of the first embodiment.
Figure 8B:
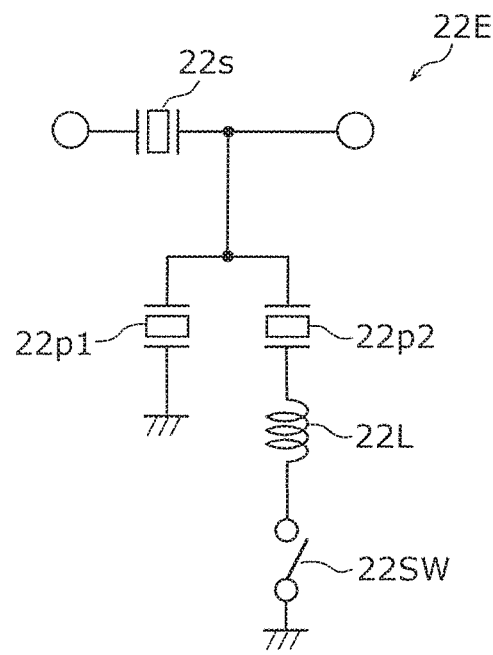
FIG. 8B is a circuit configuration diagram of a radio frequency filter circuit according to a second modification of the first embodiment.

FIG. 8A is a circuit configuration diagram of a radio frequency filter circuit 22D according to a first modification of the first embodiment. FIG. 8B is a circuit configuration diagram of a radio frequency filter circuit 22E according to a second modification of the first embodiment. As illustrated in FIGS. 8A and 8B, circuit configurations of the radio frequency filter circuits 22D and 22E according to the first modification and the second modification are different from the circuit configuration of the radio frequency filter circuit 22A according to the first embodiment in that an inductor is added and inserted in series between a parallel-arm resonator and a ground terminal. Hereinafter, explanations for the same features as those of the radio frequency filter circuit 22A according to the first embodiment will be omitted, and explanation for different features will be focused on.

As illustrated in FIG. 8A, the radio frequency filter circuit 22D according to the first modification of the first embodiment includes the series-arm resonator 22s, the parallel-arm resonators 22p1 and 22p2, the switch 22SW, an inductor 22L, the input terminal 22m, and the output terminal 22n. In the first modification, the inductor 22L is connected to the parallel-arm resonator 22p1 and the ground terminal.

In the radio frequency filter circuit 22D, the parallel-arm resonator 22p1 and the inductor 22L are connected in series between a node on a path connecting the input terminal 22m and the output terminal 22n, and the ground terminal. However, the connection order of the parallel-arm resonator 22p1 and the inductor 22L is not limited. However, as illustrated in FIG. 8A, the parallel-arm resonator 22p1, out of the parallel-arm resonator 22p1 and the inductor 22L, can be arranged on the node side. By adding the inductor 22L, a resonant point of a parallel resonant circuit including the parallel-arm resonator 22p1 is shifted toward a lower frequency side. However, if the inductor 22L is arranged on the node side, a resistance component of the inductor 22L causes loss in the radio frequency filter circuit 22D to be increased. This is because an anti-resonant point (impedance ∞) of the parallel-arm resonator 22p1 is arranged in a pass band and arranging the inductor 22L on the node side causes a radio frequency input signal to pass through the inductor 22L and reflect in the pass band.

Furthermore, as illustrated in FIG. 8B, the radio frequency filter circuit 22E according to the second modification of the first embodiment includes the series-arm resonator 22s, the parallel-arm resonators 22p1 and 22p2, the switch 22SW, the inductor 22L, the input terminal 22m, and the output terminal 22n. In the second modification, the inductor 22L is connected to the parallel-arm resonator 22p2 and the switch 22SW. In the second embodiment, the inductor 22L may be connected to the switch 22SW and the ground terminal.

In the radio frequency filter circuit 22E, the parallel-arm resonator 22p2, the inductor 22L, and the switch 22SW are connected in series between a node on a path connecting the input terminal 22m and the output terminal 22n, and the ground terminal. However, the connection order of the parallel-arm resonator 22p2, the inductor 22L, and the switch 22SW is not limited to this. However, as illustrated in FIG. 8B, the parallel-arm resonator 22p2, out of the parallel-arm resonator 22p2, the inductor 22L, and the switch 22SW, can be arranged on the node side. When the inductor 22L is arranged on the node side, a resistance component of the inductor 22L causes loss in the radio frequency filter circuit 22E to be increased. Furthermore, when the switch SW is arranged on the node side, a resistance component of the switch SW in a switched-on state causes loss in the radio frequency filter circuit 22E to be increased.

Now, resonance characteristics in the case where an inductor is connected in series with a parallel-arm resonator will be explained using an equivalent circuit model.

Figure 9:
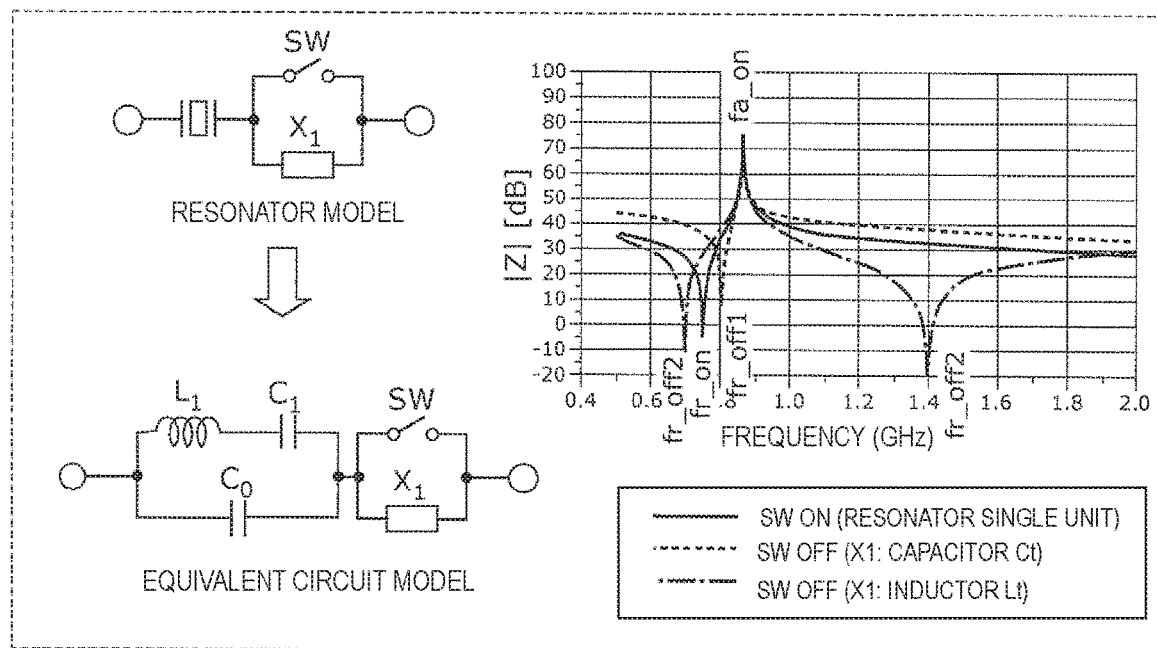
FIG. 9 is a diagram illustrating an equivalent circuit model for a case where an impedance element is connected in series with a resonator and resonance characteristics of the case where the impedance element is connected in series with the resonator.

FIG. 9 is a diagram illustrating an equivalent circuit model in the case where an impedance element $X_1$ is connected in series with a resonator and resonance characteristics of this case. As illustrated in FIG. 9, the resonator may be represented by a parallel circuit including the capacitor $C_0$ and a series circuit including the capacitor $C_1$ and the inductor $L_1$. The capacitor $C_0$ represents the electrostatic capacitance of the resonator. Furthermore, a parallel circuit including the impedance element $X_1$ and a switch SW is connected to the resonator.

First, resonance characteristics of the above-mentioned equivalent circuit in the case where the switch SW is on will be explained. A resonant frequency fr_on and anti-resonant frequency fa_on in the case where the switch SW is on are the same as the resonant frequency fr and the anti-resonant frequency fa in FIG. 6A and may be represented by Equation 7 and Equation 8.

[Math. 7]

$$f_r\_on = \frac{1}{2\pi\sqrt{L_1 C_1}} \quad \text{(Equation 7)}$$

[Math. 8]

$$f_a\_on = \frac{\sqrt{1 + \frac{C_1}{C_0}}}{2\pi\sqrt{L_1 C_1}} \quad \text{(Equation 8)}$$

Next, for the case where the switch SW is off, (1) case where the impedance element $X_1$ is a capacitor and (2) case where the impedance element $X_1$ is an inductor will be explained separately.

(1) Case where the Impedance Element $X_1$ is a Capacitor $C_t$

A resonant frequency fr_off1 in the case where the switch SW is off is a frequency at which an impedance Z of the equivalent circuit is 0 and may therefore be represented by Equation 10 by solving Equation 9.

[Math. 9]

$$Z = 0 = \frac{1}{j\omega C_0 + \frac{j\omega C_1}{-\omega^2 L_1 C_1 + 1}} + \frac{1}{j\omega C_t} \quad \text{(Equation 9)}$$

[Math. 10]

$$f_r\_off1 = \frac{\sqrt{\frac{C_0 + C_1 + C_t}{L_1 C_1 C_t - L_1 C_0 C_t}}}{2\pi} \quad \text{(Equation 10)}$$

In contrast, an anti-resonant frequency fa_off1 in the case where the switch SW is off is the same as the anti-resonant frequency fa_on in the case where the switch SW is on and may be represented by Equation 11.

[Math. 11]

$$f_a\_off1 = \frac{\sqrt{1 + \frac{C_1}{C_0}}}{2\pi\sqrt{L_1 C_1}} \quad \text{(Equation 11)}$$

According to Equation 7, Equation 8, Equation 10, and Equation 11, in the case where the impedance element $X_1$ is a capacitor, the anti-resonant frequency fa_on and the anti-resonant frequency fa_off1 are the same, irrespective of whether the switch SW is on or off, as illustrated in a right graph of FIG. 9. In contrast, it is shown that the resonant frequency (fr_off1) in the case where the switch SW is off is shifted toward a higher frequency side compared to the resonant frequency (fr_on) in the case where the switch SW is on.

(2) Case where the Impedance Element $X_1$ is an Inductor $L_t$

A resonant frequency fr_off2 in the case where the switch SW is off is a frequency at which the impedance Z of the equivalent circuit is 0 and may therefore be represented by Equation 13 by solving Equation 12.

[Math. 12]

$$Z = 0 = \frac{1}{j\omega C_0 + \frac{j\omega C_1}{-\omega^2 L_1 C_1 + 1}} + j\omega L_t \quad \text{(Equation 12)}$$

[Math. 13]

$$f_r\_off2 = \frac{\sqrt{\frac{-b \pm \sqrt{b^2 4ac}}{2a}}}{2\pi} \quad \text{(Equation 13)}$$

$$a = L_1 L_t C_0 C_1$$
$$b = -L_1 C_1 - L_t C_0 - L_t C_1$$
$$c = 1$$

In contrast, an anti-resonant frequency fa_off2 in the case where the switch SW is off is the same as the anti-resonant frequency fa_on in the case where the switch SW is on and may be represented by Equation 14.

[Math. 14]

$$f_a\_off2 = \frac{\sqrt{1 + \frac{C_1}{C_0}}}{2\pi\sqrt{L_1 C_1}} \quad \text{(Equation 14)}$$

According to Equations 7, Equation 8, Equation 13, and Equation 14, in the case where the impedance element $X_1$ is an inductor, the anti-resonant frequency fa_on and the anti-resonant frequency fa_off2 are the same, irrespective of whether the switch SW is on or off, as illustrated in the right graph of FIG. 9. In contrast, it is shown that the resonant frequency (fr_off2) in the case where the switch SW is off is shifted toward a lower frequency side compared to the resonant frequency (fr_on) in the case where the switch SW is on.

With the configuration according to the first modification, by connecting the inductor 22L in series with the parallel-arm resonator 22p1, the resonant frequency of the parallel-arm resonator 22p1 is shifted toward a lower frequency side, and therefore, the band width of the radio frequency filter circuit 22D may be increased. With the configuration according to the second modification, by inserting the inductor 22L in series, the combined resonant frequency of the inductor 22L and the parallel-arm resonator 22p2 is lowered, and therefore, a high resonant frequency may be designed for the parallel-arm resonator 22p2 taking into consideration the decrease in the combined resonant frequency. Accordingly, the parallel-arm resonator 22p2 added to the ladder filter circuit may be miniaturized, and space saving can thus be achieved.

[1.6 Configuration of Radio Frequency Filter Circuit According to Third Modification]

Figure 10:
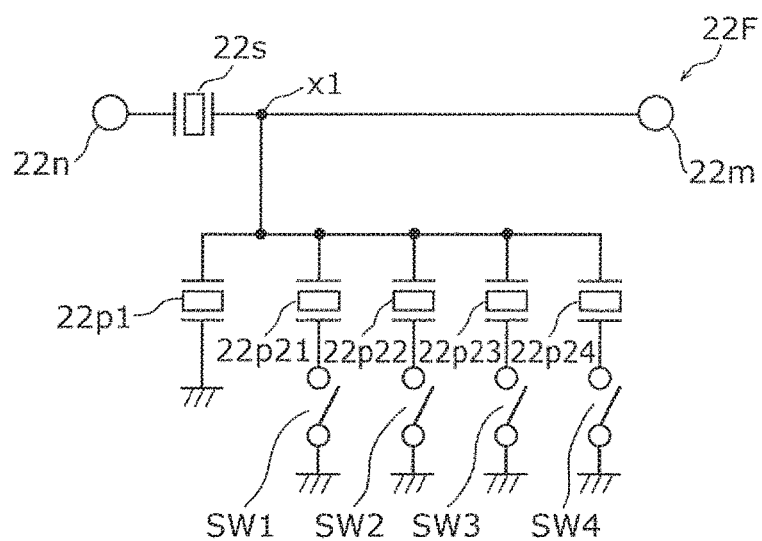
FIG. 10 is a circuit configuration diagram of a radio frequency filter circuit according to a third modification of the first embodiment.

FIG. 10 is a circuit configuration diagram of a radio frequency filter circuit 22F according to a third modification of the present disclosure. As illustrated in FIG. 10, a circuit configuration of the radio frequency filter circuit 22F according to the third modification is different from that of the radio frequency filter circuit 22A according to the first embodiment in that a plurality of circuits each including a parallel-arm resonator for band width adjustment and a switch element that are connected in series are connected in parallel with the parallel-arm resonator 22p1. Hereinafter, explanation for the same features as those of the radio frequency filter circuit 22A according to the first embodiment will be omitted, and explanation for different features will be focused on.

As illustrated in FIG. 10, the radio frequency filter circuit 22F includes the series-arm resonator 22s, parallel-arm resonators 22p1, 22p21, 22p22, 22p23, and 22p24, switches SW1, SW2, SW3, and SW4, the input terminal 22m, and the output terminal 22n.

The parallel-arm resonators 22p21 to 22p24 are second parallel-arm resonators that are connected between the node x1 and ground terminals.

The switches SW1 to SW4 are switch elements that are arranged between the node x1 and the ground terminals and switch between electrical connection and electrical non-connection of paths connecting the node x1, the parallel-arm resonators 22p21 to 22p24, and the ground terminals. In this embodiment, the switches SW1 to SW4 are connected to the parallel-arm resonators 22p21 to 22p24, respectively, and the corresponding ground terminals. That is, in the radio frequency filter circuit 22F, a resonant circuit including the parallel-arm resonator 22p21 and the switch SW1 that are connected in series, a resonant circuit including the parallel-arm resonator 22p22 and the switch SW2 that are connected in series, a resonant circuit including the parallel-arm resonator 22p23 and the switch SW3 that are connected in series, and a resonance circuit including the parallel-arm resonator 22p24 and the switch SW4 that are connected in series are connected in parallel between the node x1 and the ground terminals.

In the radio frequency filter circuit 22F, a connection order of the parallel-arm resonator 22p21 and the switch SW1, a connection order of the parallel-arm resonator 22p22 and the switch SW2, a connection order of the parallel-arm resonator 22p23 and the switch SW3, and a connection order of the parallel-arm resonator 22p24 and the switch SW4 are not limited. However, as illustrated in FIG. 10, the parallel-arm resonators 22p21, 22p22, 22p23, and 22p24 can be arranged closer to the node x1 than the switches SW1, SW2, SW3, and SW4 are. This is because if the switches SW1 to SW4 are arranged closer to the node x1, resistance components of the switches SW1 to SW4 in a switch-on state cause loss in the radio frequency filter circuit 22F to be increased.

Furthermore, resonant frequencies of the parallel-arm resonators 22p21 to 22p24 are different from one another.

With the above configuration, regarding the pass band characteristics defined by the series-arm resonator 22s and the parallel-arm resonator 22p1, by desirably selecting between the switches SW1 to SW4 to be electrically connected, fine adjustment of the band width can be achieved.

The resonant frequencies of the parallel-arm resonators 22p21 to 22p24 may be the same. In this case, resistance in the switch-on state can be reduced, and loss in the pass band can thus be reduced.

Second Embodiment

In the first embodiment, a configuration in which the parallel-arm resonator 22p2 for varying transmission characteristics and the switch 22SW are added to the single series-arm resonator 22s and the single parallel-arm resonator 22p1 has been explained. In contrast, in a second embodiment, a radio frequency filter circuit including filter structures of a plurality of stages each including a combination of a single series-arm resonator and a single parallel-arm resonator will be explained.

[2.1 Configuration of Radio Frequency Filter Circuit]

Figure 11A:
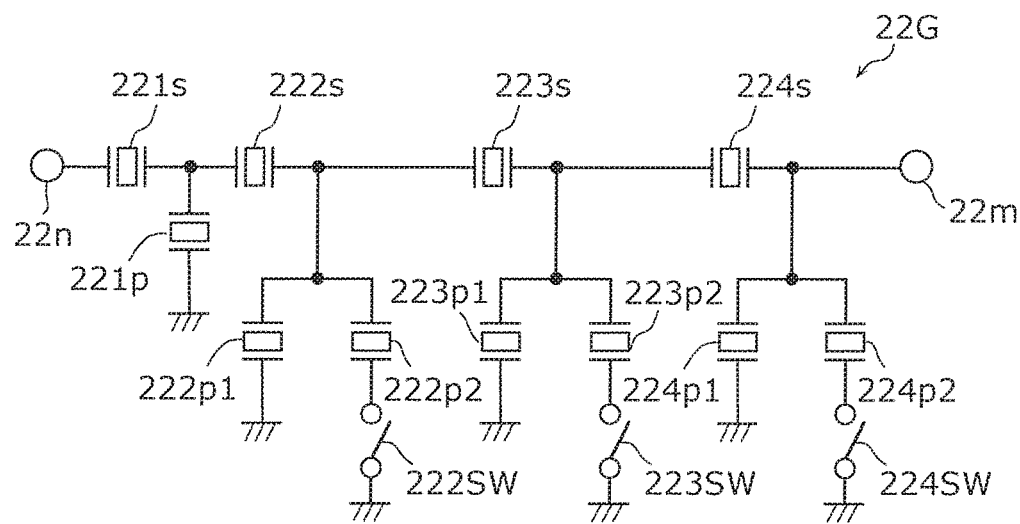
FIG. 11A is a circuit configuration diagram of a radio frequency filter circuit according to a second embodiment.

FIG. 11A is a circuit configuration diagram of a radio frequency filter circuit 22G according to the second embodiment. Hereinafter, explanation for the same features as those of the radio frequency filter circuit 22A according to the first embodiment will be omitted, and explanation for different features will be focused on.

As illustrated in FIG. 11A, the radio frequency filter circuit 22G is a ladder filter circuit including series-arm resonators 221s, 222s, 223s, and 224s and parallel-arm resonators (first parallel-arm resonators) 221p, 222p1, 223p1, and 224p1.

The radio frequency filter circuit 22G further includes parallel-arm resonators (second parallel-arm resonators) 222p2, 223p2, and 224p2 for varying transmission characteristics and switches (switch elements) 222SW, 223SW, and 224SW. A circuit in which the parallel-arm resonator 222p2 and the switch 222SW are connected in series is connected in parallel with the parallel-arm resonator 222p1. Furthermore, a circuit in which the parallel-arm resonator 223p2 and the switch 223SW are connected in series is connected in parallel with the parallel-arm resonator 223p1. Furthermore, a circuit in which the parallel-arm resonator 224p2 and the switch 224SW are connected in series is connected in parallel with the parallel-arm resonator 224p1. That is, three parallel-arm circuits, among a plurality of parallel-arm circuits, each include a second parallel-arm resonator and a switch element.

A resonant frequency of the parallel-arm resonator 222p2 is higher than a resonant frequency of the parallel-arm resonator 222p1, a resonant frequency of the parallel-arm resonator 223p2 is higher than a resonant frequency of the parallel-arm resonator 223p1, and a resonant frequency of the parallel-arm resonator 224p2 is higher than a resonant frequency of the parallel-arm resonator 224p1.

[2.2 Transmission Characteristics of Radio Frequency Filter Circuit]

Figure 11B:
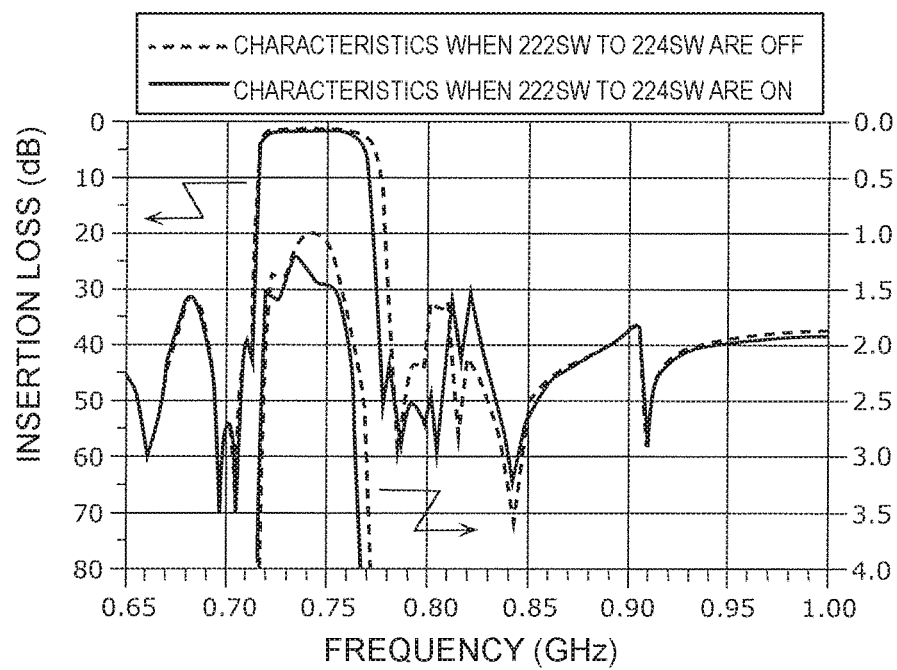
FIG. 11B is a graph illustrating transmission characteristics of the radio frequency filter circuit according to the second embodiment.

FIG. 11B is a graph illustrating transmission characteristics of the radio frequency filter circuit 22G according to the second embodiment. In the graph of FIG. 11B, the transmission characteristics of the radio frequency filter circuit 22G between the input terminal 22m and the output terminal 22n are illustrated. Transmission characteristics (broken line) for a case where all the switches 222SW to 224SW are off and transmission characteristics (solid line) for a case where all the switches 222SW to 224SW are on are illustrated.

In the case where all the switches 222SW to 224SW are on, the resonant frequency of the parallel-arm resonator 222p2 is higher than the resonant frequency of the parallel-arm resonator 222p1. Furthermore, the resonant frequency of the parallel-arm resonator 223p2 is higher than the resonant frequency of the parallel-arm resonator 223p1. Furthermore, the resonant frequency of the parallel-arm resonator 224p2 is higher than the resonant frequency of the parallel-arm resonator 224p1. Therefore, the anti-resonant frequencies of parallel resonant circuits including the parallel-arm resonators 222p2 to 224p2 are shifted toward a lower frequency side relative to the anti-resonant frequencies of the parallel-arm resonators 222p1 to 224p1, respectively. In addition, impedances at a higher frequency end of the pass bands of the parallel resonant circuits including the parallel-arm resonators 222p2 to 224p2 are lower than impedances at a higher frequency end of the pass bands of the parallel-arm resonators 222p1 to 224p1. Therefore, attenuation on a higher frequency side of the pass band in the case where the switches 222SW to 224SW are on is higher than that in the case where the switches 222SW to 224SW are off. Thus, the higher frequency end of the pass band of the radio frequency filter circuit 22G in the case where the switches 222SW to 224SW are on is shifted toward a lower frequency side relative to the higher frequency end of the pass band of the radio frequency filter circuit 22G in the case where the switches 222SW to 224SW are off, and the bandwidth is narrowed.

In the radio frequency filter circuit 22G according to this embodiment, the resonant frequencies of the parallel-arm resonators 222p2 to 224p2 are the same, and the switches 222SW to 224SW are collectively turned on and off. Accordingly, compared with the radio frequency filter circuit 22A according to the first embodiment, the band width in the switch-on state can be further narrowed.

[2.3 Configuration of Radio Frequency Filter Circuit According to Modification]

A circuit configuration of a radio frequency filter circuit 22H according to this modification is different from that of the radio frequency filter circuit 22G according to the second embodiment in resonant frequencies of a plurality of second parallel-arm resonators and that a plurality of switch elements are individually turned on and off. Hereinafter, explanation for the same features as those of the radio frequency filter circuit 22G according to the second embodiment will be omitted, and explanation for different features will be focused on.

Figure 12A:
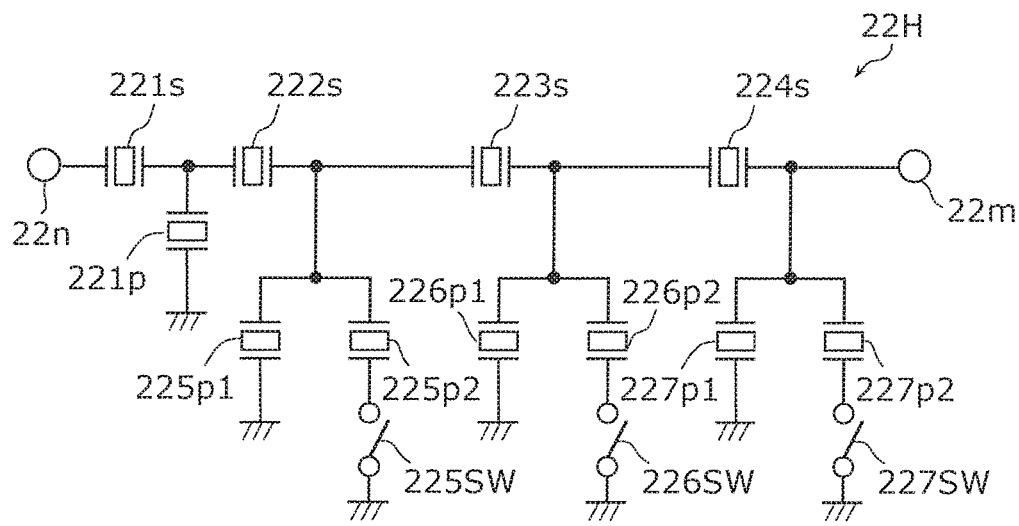
FIG. 12A is a circuit configuration diagram of a radio frequency filter circuit according to a modification of the second embodiment.

FIG. 12A is a circuit configuration diagram of the radio frequency filter circuit 22H according to the modification of the second embodiment. As illustrated in FIG. 12A, the radio frequency filter circuit 22H is a ladder filter circuit including series-arm resonators 221s, 222s, 223s, and 224s and parallel-arm resonators (first parallel-arm resonators) 221p, 225p1, 226p1, and 227p1. In the case where a configuration including a series-arm resonator and a parallel-arm resonator connected to the series-arm resonator is defined as a filter structure of one stage, the series-arm resonator 221s and the parallel-arm resonator 221p form a filter structure of one stage, the series-arm resonator 222s and the parallel-arm resonator 225p1 form a filter structure of one stage, the series-arm resonator 223s and the parallel-arm resonator 226p1 form a filter structure of one stage, and the series-arm resonator 224s and the parallel-arm resonator 227p1 form a filter structure of one stage. That is, the radio frequency filter circuit 22H configures filter structures of four stages.

The radio frequency filter circuit 22H further includes parallel-arm resonators (second parallel-arm resonators) 225p2, 226p2, and 227p2 for varying transmission characteristics and switches (switch elements) 225SW, 226SW, and 227SW. A circuit in which the parallel-arm resonator 225p2 and the switch 225SW are connected in series is connected in parallel with the parallel-arm resonator 225p1. Furthermore, a circuit in which the parallel-arm resonator 226p2 and the switch 226SW is connected in parallel with the parallel-arm resonator 226p1. Furthermore, a circuit in which the parallel-arm resonator 227p2 and the switch 227SW are connected in series is connected in parallel with the parallel-arm resonator 227p1. That is, filter structures of three-stages, among filter structures of a plurality of stages, each include a second parallel-arm resonator and a switch element.

A resonant frequency of the parallel-arm resonator 225p2 is higher than a resonant frequency of the parallel-arm resonator 225p1, a resonant frequency of the parallel-arm resonator 226p2 is higher than a resonant frequency of the parallel-arm resonator 226p1, and a resonant frequency of the parallel-arm resonator 227p2 is higher than a resonant frequency of the parallel-arm resonator 227p1.

Furthermore, the resonant frequency of the parallel-arm resonator 225p2 is lower than the resonant frequency of the parallel-arm resonator 226p2, and the resonant frequency of the parallel-arm resonator 226p2 is lower than the resonant frequency of the parallel arm resonator 227p2 (resonant frequency of parallel-arm resonator 225p2<resonant frequency of parallel-arm resonator 226p2<resonant frequency of parallel-arm resonator 227p2). In FIG. 10A, a parallel-arm resonator having a lower resonant frequency is arranged on the output terminal 22n side. However, the order of arrangement of the resonators is not limited to this.

[2.4 Transmission Characteristics of Radio Frequency Filter Circuit According to Modification]

Figure 12B:
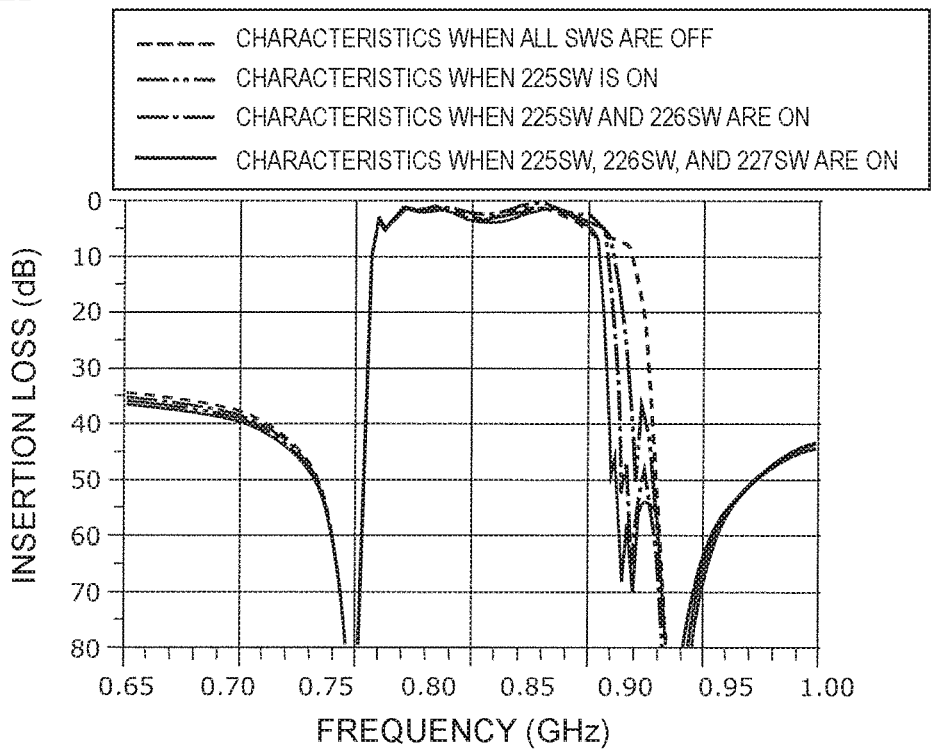
FIG. 12B is a graph illustrating transmission characteristics of the radio frequency filter circuit according to the modification of the second embodiment.

FIG. 12B is a graph illustrating the transmission characteristics of the radio frequency filter circuit 22H according to the modification of the second embodiment. In the graph of FIG. 12B, transmission characteristics (broken line) in the case where all the switches 225SW to 227SW are off, transmission characteristics (two-dotted chain line) in the case where only the switch 225SW is on, transmission characteristics (one-dotted chain line) in the case where the switches 225SW and 226SW are on, and transmission characteristics (solid line) in the case where all the switches 225SW to 227SW are on.

Accordingly, as the number of switches, among the switches 225SW to 227SW, that are in the on state increases, attenuation on the higher frequency side of the pass band increases. Therefore, as the number of switches 225SW to 227SW that are on increases, the higher frequency end of the pass band of the radio frequency filter circuit 22H is shifted toward a lower frequency side, and a narrower band width can be obtained.

With the configuration of this modification, by selecting between switch elements, finer adjustment of the band width can be achieved.

In the second embodiment and the modification of the second embodiment, the number of parallel-arm circuits and series-arm circuits of the radio frequency filter circuits 22G and 22H is not limited to four.

Third Embodiment

In this embodiment, a change in filter characteristics by an off capacitance of a switch connected to a parallel-arm resonator and a characteristic impedance of wiring connecting the parallel-arm resonator and the switch in the radio frequency filter circuits according to the first and second embodiments will be explained.

[3.1 Configuration of Radio Frequency Filter Circuit]

Figure 13:
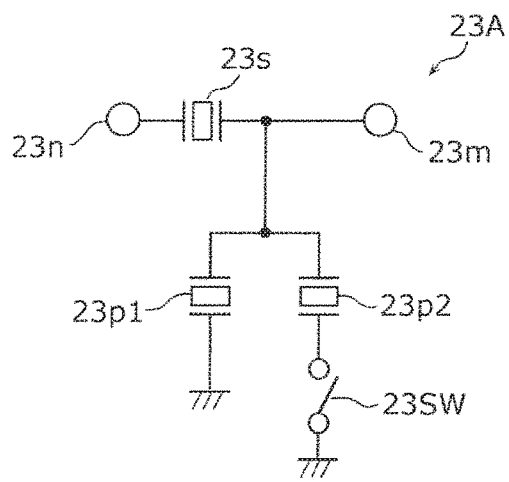
FIG. 13 is a circuit configuration diagram illustrating a radio frequency filter circuit according to a third embodiment.
Figure 14:
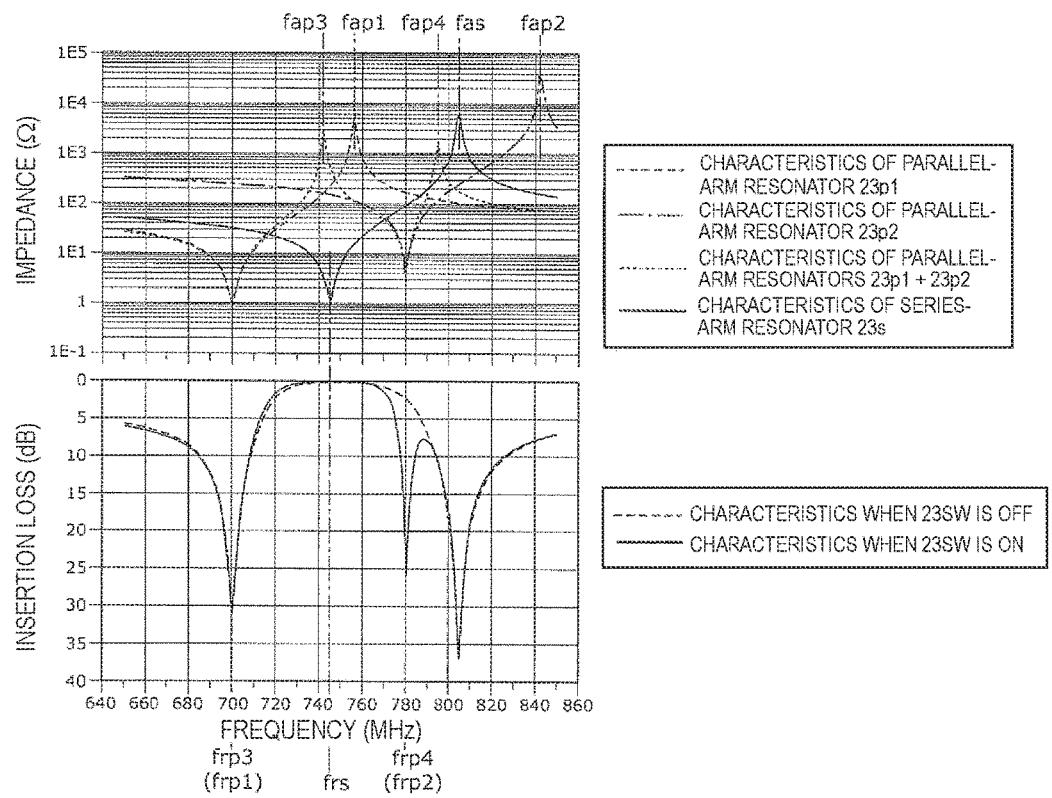

FIG. 13 is a circuit configuration diagram illustrating a radio frequency filter circuit 23A according to a third embodiment. FIG. 14 is a graph illustrating a comparison of impedance characteristics and transmission characteristics between a case where a switch of the radio frequency filter circuit 23A according to the third embodiment is off and a case where the switch of the radio frequency filter circuit 23A is on. A circuit configuration of the radio frequency filter circuit 23A according to this embodiment is the same as that of the radio frequency filter circuit 22A according to the first embodiment, and filter characteristics of the radio frequency filter circuit 23A and filter characteristics of the radio frequency filter circuit 22A are substantially the same.

In the case where a switch 23SW is off, the impedance of a parallel-arm resonator 23p2 is substantially infinite, and therefore, the impedance characteristics of the radio frequency filter circuit 23A are impedance characteristics in which impedance characteristics of a series-arm resonator 23s (solid line in an upper graph of FIG. 14) and impedance characteristics of a parallel-arm resonator 23p1 (rough broken line in the upper graph of FIG. 14) are combined together. Therefore, the radio frequency filter circuit 23A in the case where the switch 23SW is off serves as a band pass filter (broken line in a lower graph in FIG. 14) in which a resonant frequency frp1 of the parallel-arm resonator 23p1 is defined as an attenuation pole on a lower frequency side, an anti-resonant frequency fas of the series-arm resonator 23s is defined as an attenuation pole on a higher frequency side, and an anti-resonant frequency fap1 of the parallel-arm resonator 23p1 and a resonant frequency frs of the series-arm resonator 23s form a pass band.

In contrast, in the case where the switch 23SW is on, the impedance characteristics of the radio frequency filter circuit 23A are impedance characteristics in which the impedance characteristics of the series-arm resonator 23s (solid line in the upper graph of FIG. 14) and the impedance characteristics of a parallel resonant circuit in which the parallel-arm resonators 23p1 and 23p2 are connected in parallel (thin broken line in the upper graph of FIG. 14) are combined together. The impedance characteristics of the parallel resonant circuit (thin broken line in the upper graph of FIG. 14) are combined characteristics of the impedance characteristics of the parallel-arm resonator 23p1 (rough broken line in the upper graph of FIG. 14) and the impedance characteristics of the parallel-arm resonator 23p2 (one-dotted chain line in the upper graph of FIG. 14). Therefore, the radio frequency filter circuit 23A in the case where the switch 23SW is on serves as a band pass filter (solid line in the lower graph of FIG. 14) in which the resonant frequency frp3 of the parallel resonant circuit (reflecting the resonant frequency frp1 of the parallel-arm resonator 23p1) is defined as an attenuation pole on a lower frequency side and the resonant frequency frp4 of the parallel resonant circuit (reflecting the resonant frequency frp2 of the parallel-arm resonator 23p2) is defined as an attenuation pole on a higher frequency side.

When the switch 23SW is on, the resonant frequency frp2 of the parallel-arm resonator 23p2 is higher than the resonant frequency frp1 of the parallel-arm resonator 23p1. Therefore, the anti-resonant frequency fap3 of the parallel resonant circuit is shifted toward a lower frequency side relative to the anti-resonant frequency fap1 of the parallel-arm resonator 23p1, and the anti-resonant frequency fap4 of the parallel resonant circuit is shifted toward a lower frequency side relative to the anti-resonant frequency fap2 of the parallel-arm resonator 23p2. That is, the anti-resonant frequency fap3 of the parallel resonant circuit is lower than the anti-resonant frequency fap1 of the parallel-arm resonator 23p1, and the resonant frequency frp4 of the parallel resonant circuit is lower than the anti-resonant frequency fas of the series-arm resonator 23s. Therefore, the pass band width in the case where the switch 23SW is on is narrower toward the lower frequency side than the pass band width in the case where the switch 23SW is off, and the attenuation band in the case where the switch 22SW is on is shifted toward the lower frequency side relative to the attenuation band in the case where the switch 23SW is off.

That is, with the above configuration, the resonant frequency frp2 of the parallel-arm resonator 23p2 is higher than the resonant frequency frs of the series-arm resonator 23s that affects insertion loss near the center frequency in the pass band and is lower than the anti-resonant frequency fas of the series-arm resonator corresponding to the attenuation pole on the higher frequency side outside the pass band. Therefore, when the switch 23SW is on, the attenuation pole on the higher frequency side outside the pass band may be shifted toward the lower frequency side while low-loss characteristics in the pass band being maintained. Thus, when the switch 23SW is on, the higher frequency end of the pass band can be shifted toward the lower frequency side, and the pass band width can be narrowed without necessarily the steepness at the higher frequency end of the pass band being impaired.

[3.2 Characteristics of Radio Frequency Filter Circuit Based on Off Capacitance]

When the switch 23SW is off, the impedance is ideally infinite. In actuality, however, the switch 23SW has an off capacitance (Coff) as a capacitance component.

Figure 15A:
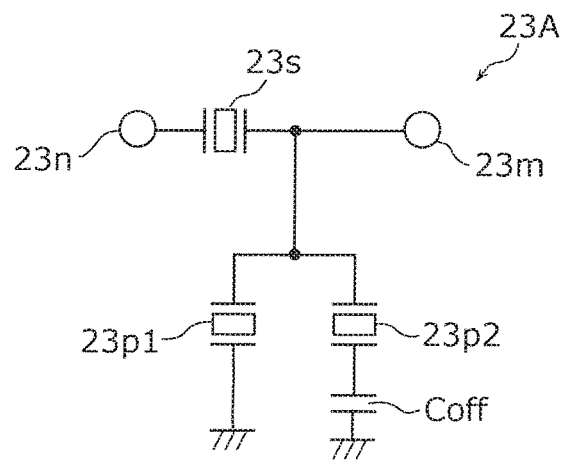
FIG. 15A is an equivalent circuit diagram in the case where a switch of the radio frequency filter circuit according to the third embodiment is off.
Figure 15B:
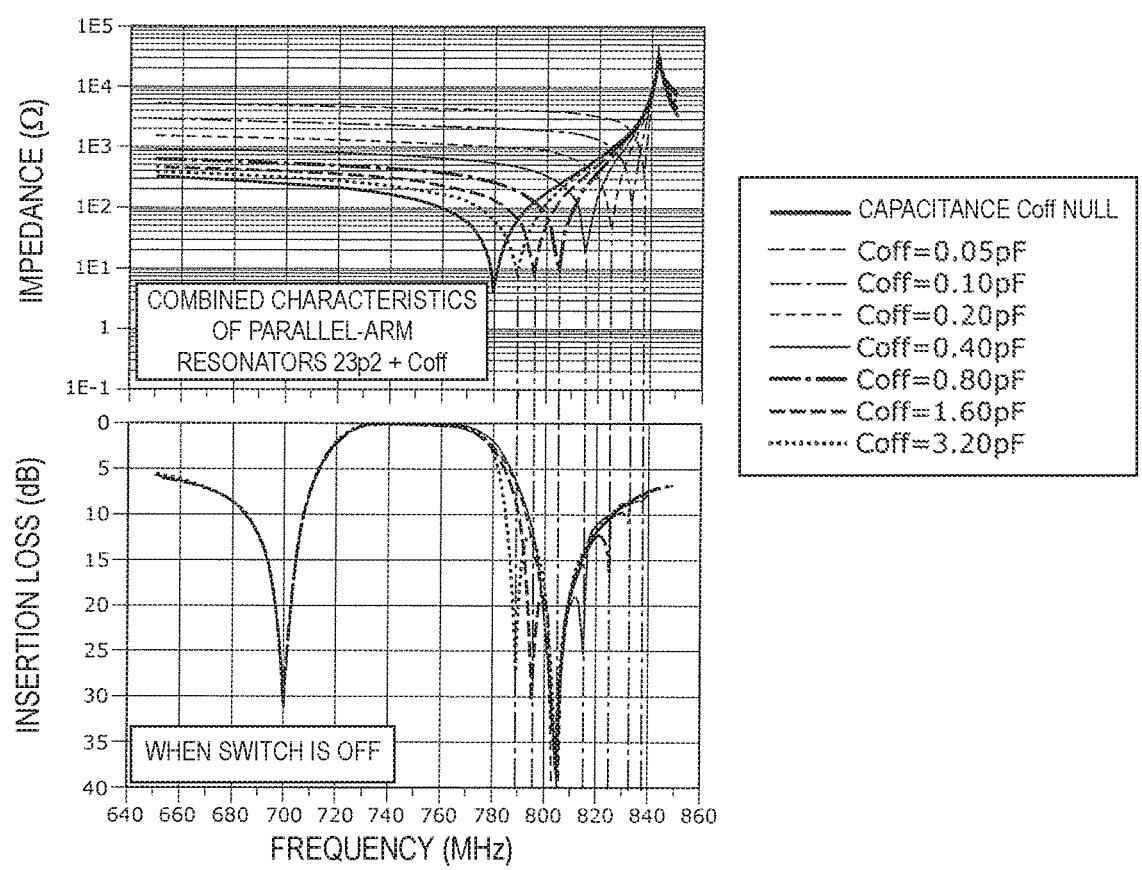
FIG. 15B is a graph illustrating a comparison of impedance characteristics and transmission characteristics in a case where the off capacitance of the radio frequency filter circuit according to the third embodiment is varied.

FIG. 15A is an equivalent circuit diagram in the case where the switch 23SW of the radio frequency filter circuit 23A according to the third embodiment is off. FIG. 15B is a graph illustrating a comparison of impedance characteristics and transmission characteristics in the case where the off capacitance of the radio frequency filter circuit 23A according to the third embodiment is varied. More specifically, an upper graph of FIG. 15B illustrates a change in the combined characteristics of the parallel-arm resonator 23p2 and the off capacitance Coff for the case where the off capacitance Coff of the switch 23SW is varied, and a lower graph of FIG. 15B illustrates a change in the filter characteristics of the radio frequency filter circuit 23A in the case where the switch 23SW is off for the case where the off capacitance Coff of the switch 23SW is varied.

As illustrated in the upper graph of FIG. 15B, by increasing the off capacitance Coff, the resonant frequency (frp2) of the combined characteristics of the parallel-arm resonator 23p2 and the off capacitance Coff is shifted toward lower frequencies. Furthermore, as illustrated in the lower graph of FIG. 15B, by increasing the off capacitance Coff, the attenuation pole (frp4) on the higher frequency side of the pass band is also shifted toward the lower frequency side. A change in the off capacitance Coff does not affect the anti-resonant frequency (fap2) of the combined characteristics of the parallel-arm resonator 23p2 and the off capacitance Coff.

Figure 15C:
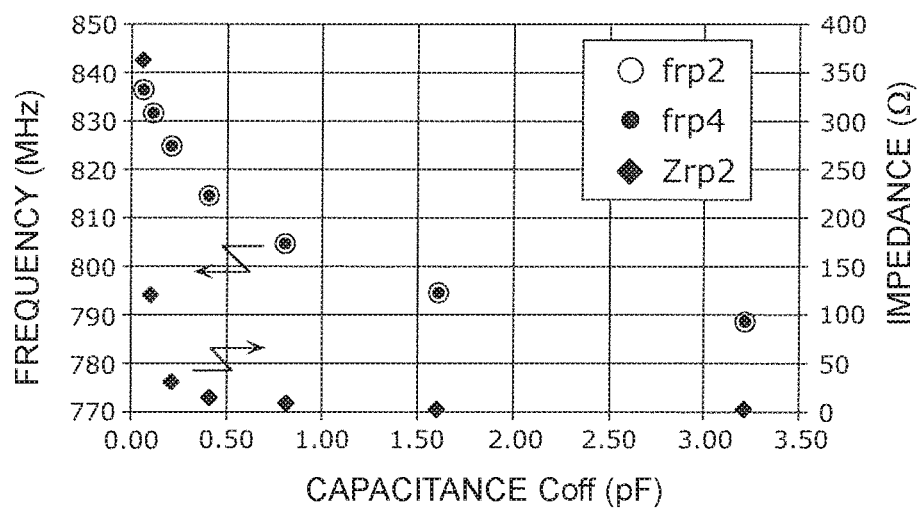
FIG. 15C is a graph illustrating the relationship of the off capacitance, resonant frequency, and impedance of the radio frequency filter circuit according to the third embodiment.

FIG. 15C is a graph illustrating the relationship of the off capacitance, the resonant frequency, and the impedance at the resonant frequency of the radio frequency filter circuit 23A according to the third embodiment.

In the case where the switch 23SW is off, ideally, it is desirable that the impedance of the switch 23SW be infinite. In actuality, however, an increase in the off capacitance Coff decreases the impedance. Therefore, due to the combined characteristics of the parallel-arm resonator 23p2 and the off capacitance Coff, a new attenuation pole (frp4) is generated, and the resonant frequency (frp2) of the combined characteristics is thus defined by the value of the off capacitance Coff.

The attenuation pole (frp4) formed by the parallel-arm resonator 23p2 in the case where the switch 23SW is on (capacitance Coff is null in the upper graph of FIG. 15B) is 780 MHz. Therefore, as the off capacitance Coff increases, the frequency variable width between on and off of the switch 23SW is narrowed. Furthermore, the above-mentioned frequency variable filter requires a frequency variable width of 20 MHz or more, and therefore, the off capacitance Coff needs to be set to 0.8 pF or less.

Accordingly, a large frequency variable width between the on-state and off-state of the switch 23SW can be ensured. The required frequency variable width described above is set, for example, based on the fact that a frequency difference at the higher frequency end of the pass band is 20 MHz in the case where a filter for varying a band 28 Tx (703 to 748 MHz) and a band 68 Tx (698 to 728 MHz) is configured.

[3.3 Characteristics of Radio Frequency Filter Circuit Based on Wiring Impedance]

Figure 16A:
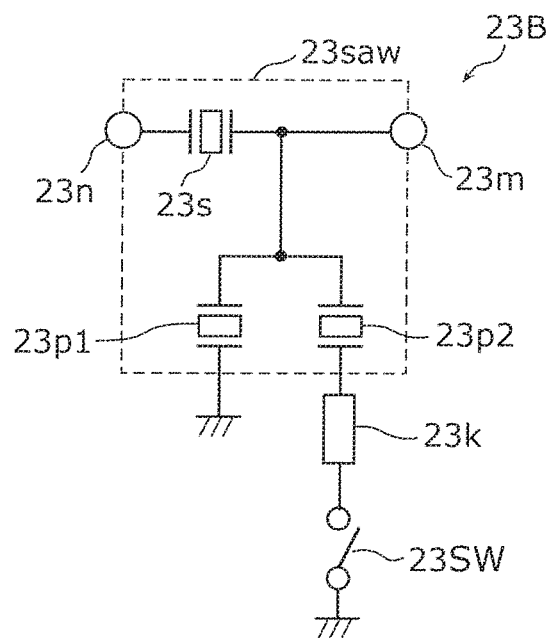
FIG. 16A is a circuit configuration diagram illustrating a radio frequency filter circuit according to a modification of the third embodiment.

FIG. 16A is a circuit configuration diagram illustrating a radio frequency filter circuit 23B according to a modification of the third embodiment. A circuit configuration of the radio frequency filter circuit 23B according to this modification is the same as those of the radio frequency filter circuit 22A according to the first embodiment and the radio frequency filter circuit 23A according to the third embodiment, and filter characteristics of the radio frequency filter circuit 23B are substantially the same as those of the radio frequency filter circuit 22A and the radio frequency filter circuit 23A. Therefore, explanation for basic filter characteristics in the case where the switch 23SW is on and off will be omitted.

In the radio frequency filter circuit 23B illustrated in FIG. 16A, a wiring 23k for connecting the parallel-arm resonator 23p2 and the switch 23SW is clearly indicated.

A "wiring impedance" means characteristic impedance of wiring. In this embodiment, for the sake of convenience, the characteristic impedance of wiring is denoted by a "wiring impedance".

[3.4 Structure of Radio Frequency Filter Circuit]

Figure 16B:
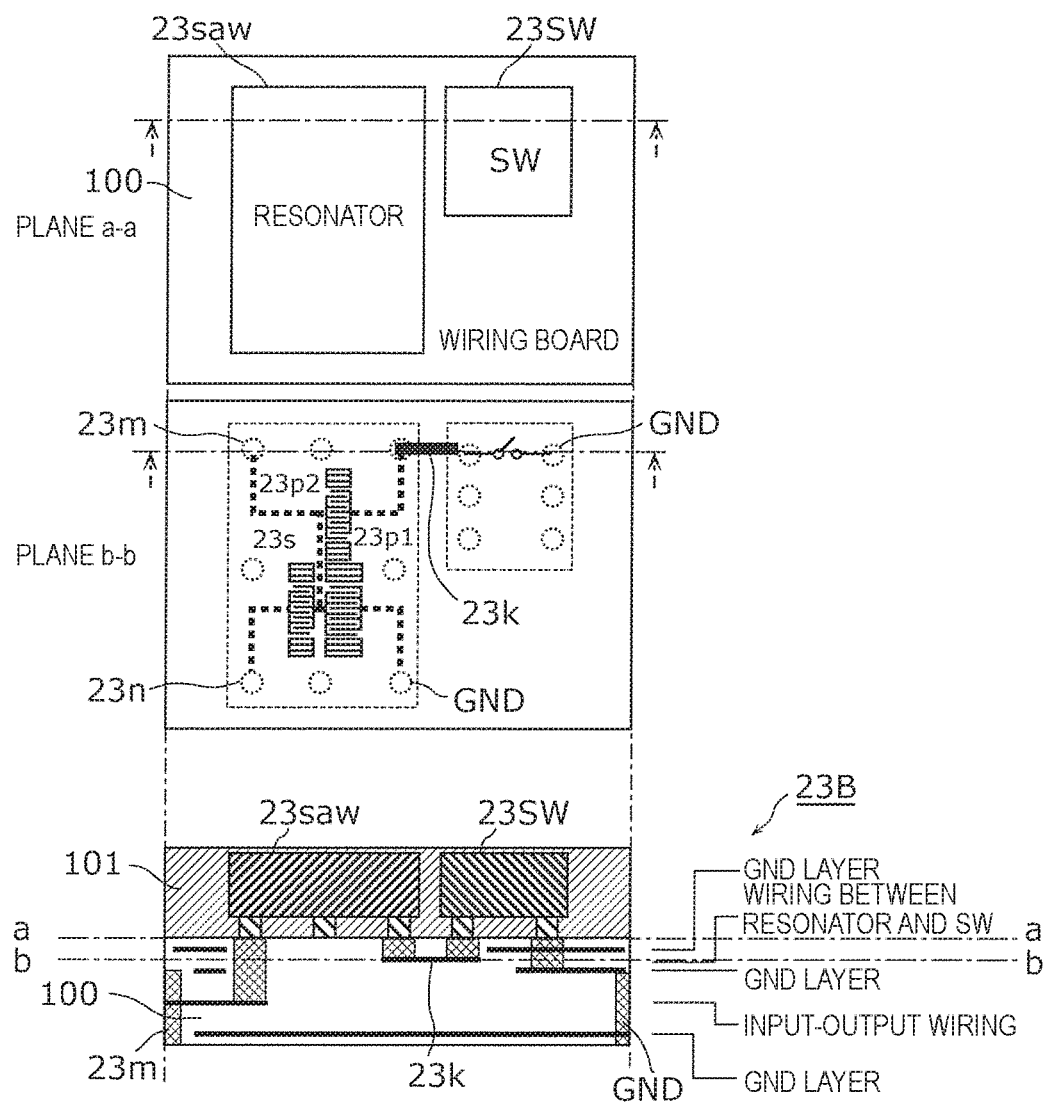
FIG. 16B is a plan view and a cross-sectional view for explaining a structure of the radio frequency filter circuit according to the modification of the third embodiment.

FIG. 16B is a plan view and a cross-sectional view for explaining a structure of the radio frequency filter circuit 23B according to the modification of the third embodiment. More specifically, a plan view viewed from above the radio frequency filter circuit 23B is illustrated in an upper part of FIG. 16B, a plan view seen through inside a wiring board is illustrated in a middle part of FIG. 16B, and a cross-sectional view is illustrated in a lower part of FIG. 16B. A surface acoustic wave resonator (23saw) including the series-arm resonator 23s and the parallel-arm resonators 23p1 and 23p2, and the switch 23SW are formed as individual packages (chips) and are mounted on a wiring board 100. The surface acoustic wave resonator (23saw) and the switch 23SW are covered with a resin member 101. An LTCC substrate or a PCB substrate is illustrated as an example of the wiring board 100. By via wiring and a wiring pattern inside the wiring board 100, the surface acoustic wave resonator (23saw) and the switch 23SW are connected. In particular, the parallel-arm resonator 23p2 and the switch 23SW are connected by a wiring 23k arranged on or inside the wiring board 100. Ideally, it is desirable that no wiring 23k be provided (a state in which the parallel-arm resonator 23p2 and the switch 23SW are directly connected). However, the surface acoustic wave resonator (23saw) and the switch 23SW are formed as individual packages, and therefore, the wiring 23k is required.

[3.5 Characteristics of Radio Frequency Filter Circuit Based on Wiring Impedance]

The characteristic impedance of the wiring 23k affects the filter characteristics of the radio frequency filter circuit 23B.

Figure 16C:
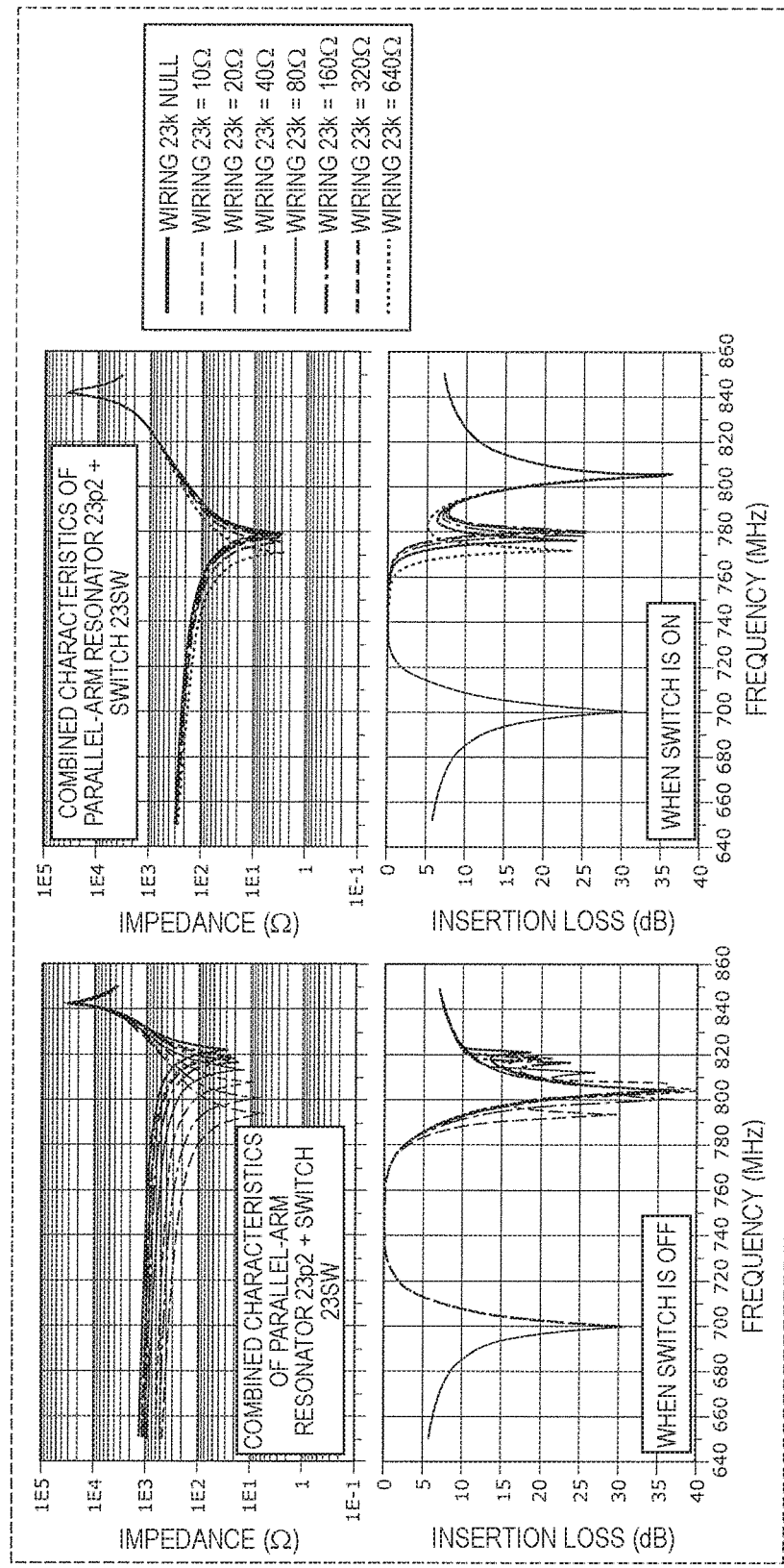
FIG. 16C is a graph illustrating a comparison of impedance characteristics and transmission characteristics in a case where the wiring impedance of the radio frequency filter circuit according to the modification of the third embodiment is varied.

FIG. 16C is a graph illustrating a comparison of impedance characteristics and transmission characteristics in the case where the wiring impedance of the radio frequency filter circuit 23B according to the modification of the third embodiment is varied. More specifically, an upper left graph of FIG. 16C illustrates a change in the combined characteristics of the parallel-arm resonator 23p2, the wiring 23k, and the switch 23SW in the case where the characteristic impedance of the wiring 23k is varied when the switch 23SW is off. An upper right graph of FIG. 16C illustrates a change in the combined characteristics of the parallel-arm resonator 23p2 and the switch 23SW in the case where the characteristic impedance of the wiring 23k is varied when the switch 23SW is on. A lower left graph of FIG. 16C illustrates a change in the filter characteristics of the radio frequency filter circuit 23B in the case where the characteristic impedance of the wiring 23k is varied when the switch 23SW is off. A lower right graph of FIG. 16C illustrates a change in the filter characteristics of the radio frequency filter circuit 23B in the case where the characteristic impedance of the wiring 23k is varied when the switch 23SW is on.

First, in the case where the switch 23SW is off, as the characteristic impedance of the wiring 23k increases, the filter characteristics of the radio frequency filter circuit 23B approach an ideal state, whereas as the characteristic impedance of the wiring 23k decreases, the attenuation pole (frp4) on the higher frequency side of the pass band is shifted toward lower frequencies.

In contrast, in the case where the switch 23SW is on, as the characteristic impedance of the wiring 23k increases, the attenuation pole (frp4) on the higher frequency side of the pass band is shifted toward lower frequencies, whereas as the characteristic impedance of the wiring 23k decreases, the filter characteristics of the radio frequency filter circuit 23B approach an ideal state.

Figure 16D:
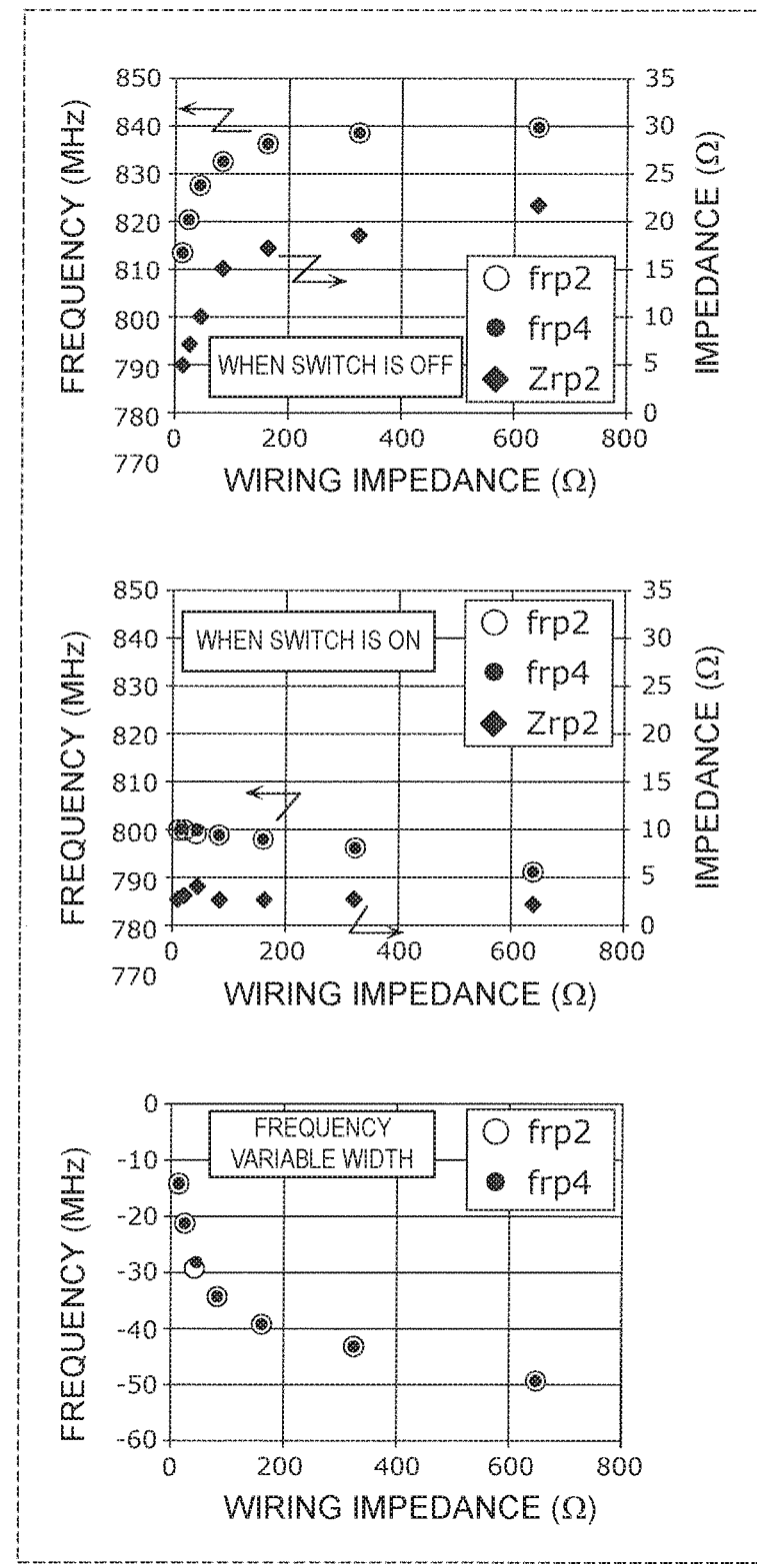
FIG. 16D is a graph illustrating the relationship of the wiring impedance, resonant frequency, and impedance of the radio frequency filter circuit according to the modification of the third embodiment.

FIG. 16D is a graph illustrating the relationship of the wiring impedance, the resonant frequency, and the impedance of the radio frequency filter circuit 23B according to the modification of the third embodiment. More specifically, in an upper part of FIG. 16D, the relationship of the characteristic impedance of the wiring 23k, the resonant frequency of the combined characteristics of the parallel-arm resonator 23p2, the wiring 23k, and the switch 23SW, and the impedance in the case where the switch 23SW is off is illustrated. In a middle part of FIG. 16D, the relationship of the impedance of the wiring 23k, the resonant frequency of the combined characteristics of the parallel-arm resonator 23p2, the wiring 23k, and the switch 23SW, and the impedance in the case where the switch 23SW is on is illustrated. In a lower part of FIG. 16D, the relationship of the characteristic impedance of the wiring 23k and a frequency variable width in the case where the switch 23SW is on and off is illustrated.

As illustrated in the lower part of FIG. 16D, when a frequency variable width, which is a frequency difference at the attenuation pole (frp4) on the higher frequency side of the pass band when the switch 23SW is on and off, is paid attention to, as the characteristic impedance of the wiring 23k increases, the frequency variable width increases. On the other hand, as the characteristic impedance of the wiring 23k decreases, the frequency variable width decreases. Furthermore, as described in the third embodiment, a frequency variable filter needs to ensure a frequency variable width of 20 MHz or more, and therefore, the characteristic impedance of the wiring 23k needs to be set to 20Ω or more.

Accordingly, a large frequency variable width between the on-state and the off-state of the switch 23SW can be ensured.

The following are methods to design a high characteristic impedance of the wiring 23k.

(1) A relative dielectric constant of the wiring board 100 is set to 15 or less.

(2) The distance between ground patterns above and below the wiring 23k is set to 100 μm or more.

(3) A configuration not including a ground above the wiring 23k is provided.

(4) A via forming the wiring 23k is set thinner than other inter-layer vias.

(5) The wiring 23k is arranged in a position upper than the center in the thickness direction of the wiring board 100 (an upper half region).

Fourth Embodiment

The radio frequency filter circuits according to the first to third embodiments have a ladder filter structure. In contrast, a radio frequency filter circuit including a longitudinally-coupled filter structure will be explained in this embodiment.

Figure 17:
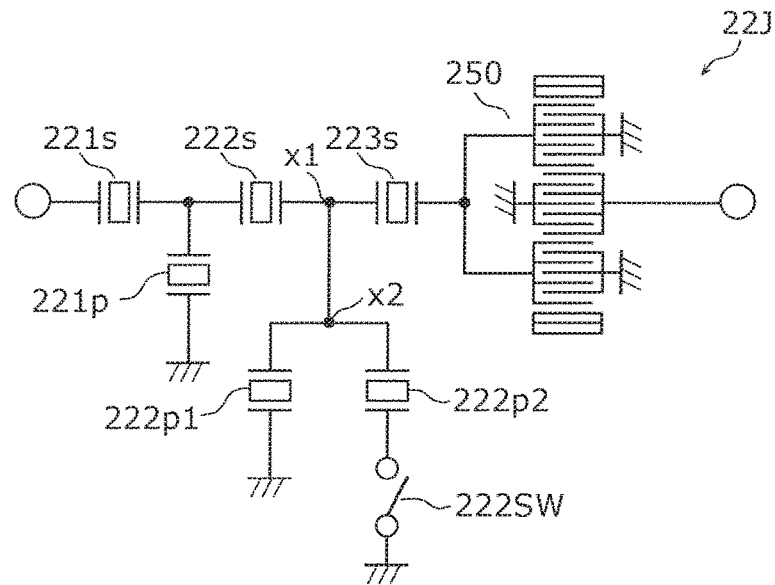
FIG. 17 is a circuit configuration diagram of a radio frequency filter circuit according to a fourth embodiment.

FIG. 17 is a circuit configuration diagram of a radio frequency filter circuit 22J according to a fourth embodiment. A circuit configuration of the radio frequency filter circuit 22J according to this embodiment is different from that of the radio frequency filter circuit 22A according to the first embodiment in that a filter structure of a longitudinally-coupled type is added. Hereinafter, the same features as those of the radio frequency filter circuit 22A according to the first embodiment will be omitted, and explanation for different features will be focused on.

As illustrated in FIG. 17, the radio frequency filter circuit 22J includes the series-arm resonators 221s, 222s, and 223s, the parallel-arm resonators 221p, 222p1, and 222p2, the switch 222SW, and a longitudinally-coupled resonator 250.

In the radio frequency filter circuit 22J, the series-arm resonators 221s to 223s and the parallel-arm resonators 221p and 222p1 form a ladder filter circuit. Furthermore, in the radio frequency filter circuit 22J, the longitudinally-coupled resonator 250 is added to the ladder filter circuit. The longitudinally-coupled resonator 250 includes three IDTs and reflectors that are arranged across the IDTs. By adding the longitudinally-coupled resonator 250, requirements for filter characteristics such as an increased band width and an enforced attenuation can be achieved.

For the basic configuration described above, the parallel-arm resonator 222p2 is connected between the node x1 and the ground terminal. Furthermore, the switch 222SW is arranged between a node x2 and the ground terminal and switches between electrical connection and electrical non-connection of a path connecting the node x2, the parallel-arm resonator 222p2, and the ground terminal.

The resonant frequency of the parallel-arm resonator 222p2 is set higher than the resonant frequency of the parallel-arm resonator 221p1. Accordingly, the attenuation on the higher frequency side of the pass band in the case where the switch 222SW is on is higher than the attenuation on the higher frequency side of the pass band in the case where the switch 222SW is off. Therefore, the higher frequency end of the pass band of the radio frequency filter circuit 22J in the case where the switch 222SW is on is shifted toward a lower frequency side relative to the higher frequency end of the pass band of the radio frequency filter circuit 22J in the case where the switch 222SW is off, and the band width is narrowed. That is, by switching of a switch element, the pass band of the filter circuit can be adjusted.

Fifth Embodiment

In this embodiment, a duplexer in which the radio frequency filter circuit according to the first, second, third, or fourth embodiment is applied to a transmission-side filter and a reception-side filter will be explained.

Figure 18:
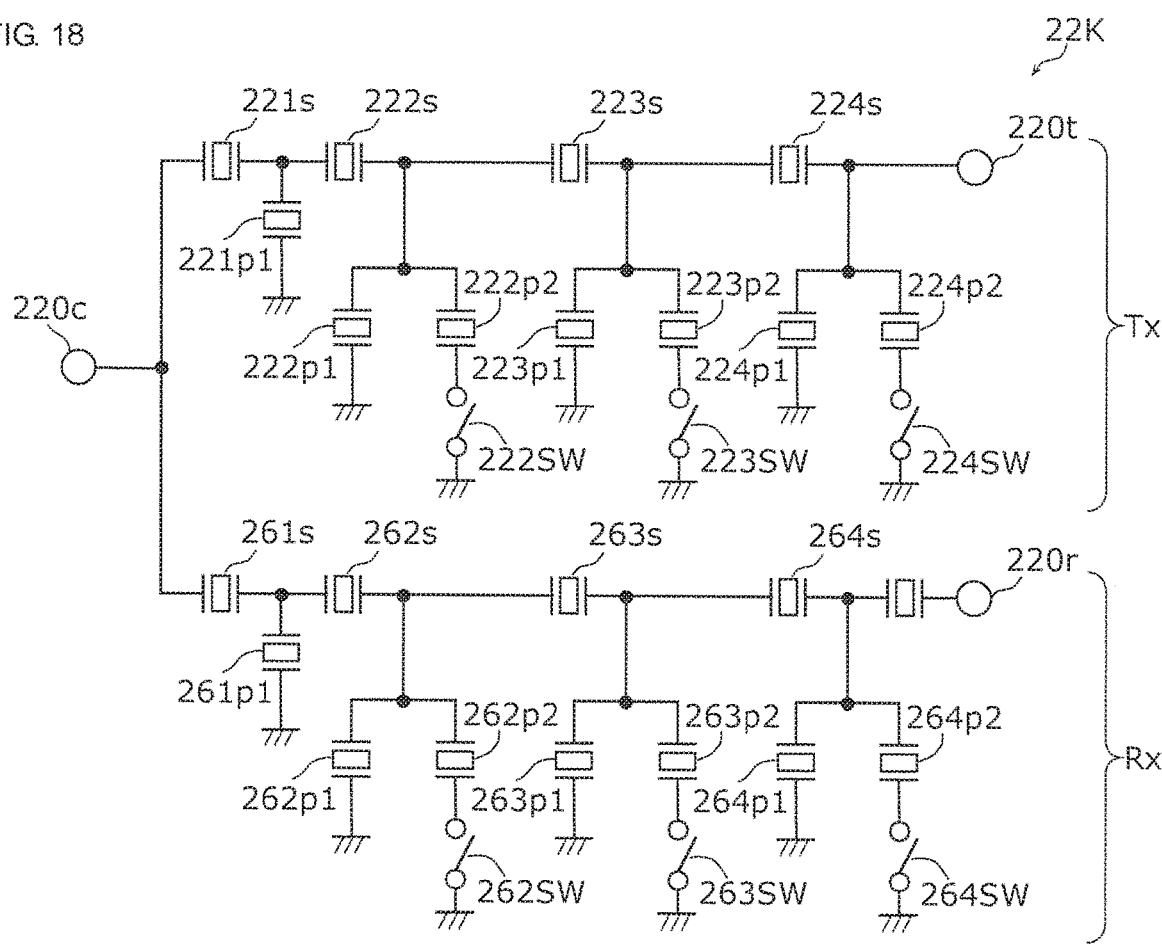
FIG. 18 is a circuit configuration diagram of a duplexer according to a fifth embodiment.
Figure 19:
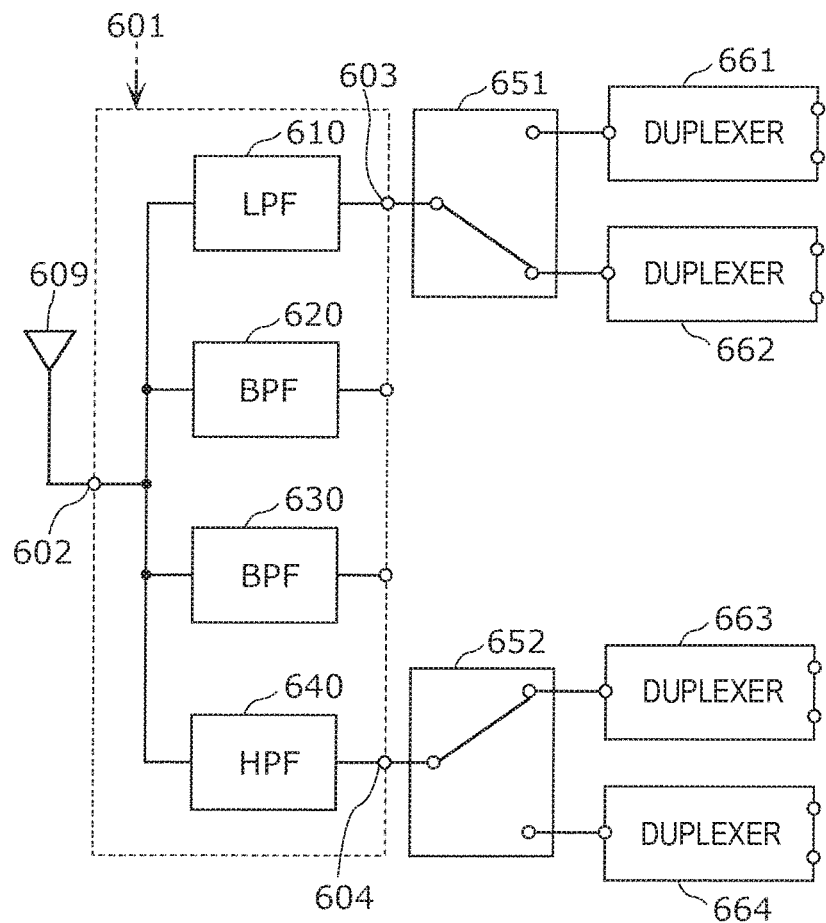
FIG. 19 is a block diagram of a front end circuit described in Patent Document 1.

FIG. 18 is a circuit configuration diagram of a duplexer 22K according to a fifth embodiment. The duplexer 22K illustrated in FIG. 18 includes a transmission-side filter Tx and a reception-side filter Rx. The transmission-side filter Tx is connected to an input terminal 220t and a common terminal 220c, and the reception-side filter Rx is connected to the common terminal 220c and an output terminal 220r.

The transmission-side filter Tx is a ladder filter circuit including the series-arm resonators 221s to 224s and the parallel-arm resonators (first parallel-arm resonators) 221p to 224p1. The transmission-side filter Tx includes filter structure of four stages. The transmission-side filter Tx further includes the parallel-arm resonators (second parallel-arm resonators) 222p2 to 224p2 for varying transmission characteristics and the switches (switch elements) 222SW to 224SW. The filter structures of three stages among plurality of stages each include a second parallel-arm resonator and a switch element.

The resonant frequency of the parallel-arm resonator 222p2 is higher than the resonant frequency of the parallel-arm resonator 222p1, the resonant frequency of the parallel-arm resonator 223p2 is higher than the resonant frequency of the parallel-arm resonator 223p1, and the resonant frequency of the parallel-arm resonator 224p2 is higher than the resonant frequency of the parallel-arm resonator 224p1.

The reception-side filter Rx is a ladder filter circuit including series-arm resonators 261s to 264s and parallel-arm resonators (first parallel-arm resonators) 261p1 to 264p1. The reception-side filter Rx has filter structures of four stages. The reception-side filter Rx further includes parallel-arm resonators (second parallel-arm resonators) 262p2 to 264p2 for varying transmission characteristics and switches (switch elements) 262SW to 264SW. Filter structures of three stages among a plurality of stages each include a second parallel-arm resonator and a switch element.

The resonant frequency of the parallel-arm resonator 262p2 is higher than the resonant frequency of the parallel-arm resonator 262p1, the resonant frequency of the parallel-arm resonator 263p2 is higher than the resonant frequency of the parallel-arm resonator 263p1, and the resonant frequency of the parallel-arm resonator 264p2 is higher than the resonant frequency of the parallel-arm resonator 264p1.

With the above configuration, in a tunable duplexer that is applied to a system for exclusively selecting between two adjacent bands, by switching between the switches 222SW to 224SW and switching between the switches 262SW to 264SW, the transmission pass band and the reception pass band of the duplexer 22K can be adjusted. Furthermore, simplification and miniaturization of the duplexer 22K can be achieved.

A duplexer according to the present disclosure is not limited to the above configuration. Any one of the radio frequency filter circuits according to the first to fourth embodiments can be applied to a transmission-side filter and a reception-side filter.

Furthermore, in a duplexer according to the present disclosure, the radio frequency filter circuit according to the first, second, third, or fourth embodiment may be applied to any one of the transmission-side filter and the reception-side filter.

(Other Embodiments etc.)

The radio frequency filter circuits and the duplexers according to embodiments of the present disclosure have been explained above in the first to fifth embodiments and the modifications thereof. However, the radio frequency filter circuits and the duplexers according to the present disclosure are not limited to the embodiments and modifications described above. Other embodiments implemented by combining desired components in the foregoing embodiments and modifications, modifications obtained by making various modifications conceivable by those skilled in the art to the foregoing embodiments without departing from the scope of the present disclosure, and various apparatuses including a radio frequency filter circuit and a duplexer disclosed herein are also included in the present disclosure.

For example, an RF front end circuit that includes the radio frequency filter circuit 22F according to the third modification of the first embodiment and a controller that controls electrical connection and electrical non-connection of the plurality of switches 22p21 to 22p24, the controller controlling electrical connection and electrical non-connection of the plurality of switches 22p21 to 22p24 separately, is also included in the present disclosure. Accordingly, in the transmission characteristics defined by a ladder filter structure including the series-arm resonator 22s and the parallel-arm resonator 22p1, by individually selecting the plurality of switch elements, selection between transmission characteristics corresponding to three or more frequency bands can be performed in an appropriate manner.

Alternatively, an RF front end circuit that includes the power amplifier 24 that amplifies a radio frequency transmission signal, a radio frequency filter circuit according to any one of the first to fourth embodiments and the modifications of the first to fourth embodiments through which the radio frequency transmission signal amplified by the power amplifier 24 passes, and a controller that controls electrical connection and electrical non-connection of a single or a plurality of switch elements is also included in the present disclosure. Accordingly, simplification and miniaturization of a transmission-system front end circuit that includes the power amplifier 24 can be achieved.

Alternatively, an RF front end circuit that includes a controller that controls electrical connection and electrical non-connection of a single or a plurality of switch elements, as a reception-side filter circuit, a radio frequency filter circuit according to any one of the first to fourth embodiments and modifications of the first to fourth embodiments through which a radio frequency reception signal received by an antenna element passes, and a low noise amplifier that amplifies the radio frequency reception signal output from the radio frequency filter circuit is also included in the present disclosure. Accordingly, simplification and miniaturization of the reception-system front end circuit that includes a low noise amplifier can be achieved.

Furthermore, a communication apparatus that includes the RFIC 3 that processes a baseband signal or a radio frequency signal and the RF front end circuit is also included in the present disclosure. Accordingly, simplification and miniaturization of the communication apparatus can be achieved. The controller that is included in the RF front end circuit may be the RFIC 3.

The radio frequency filter circuits according to the first to fourth embodiments and the modifications of the first to fourth embodiments have been described as those applied to a system for exclusively switching between adjacent frequency bands. However, the radio frequency filter circuits according to the first to fourth embodiments and the modifications of the first to fourth embodiments can also be applied to a system for exclusively switching between a plurality of adjacent channels allocated in one frequency band.

Furthermore, in the radio frequency filter circuits and duplexers according to the first to fifth embodiments and the modifications of the first to fifth embodiments, the piezoelectric substrate 50 that configures a surface acoustic wave filter may have a multilayer structure in which a high acoustic velocity supporting substrate, a low acoustic velocity film, and a piezoelectric film are laminated in this order. The piezoelectric film is formed of, for example, 50° Y-cut, X-propagation $LiTaO_3$ piezoelectric monocrystal or piezoelectric ceramics (lithium tantalate monocrystal which is cut along a plane whose normal is defined by an axis that is rotated around the X axis as a central axis by 50 degrees from the Y axis or ceramics and through which surface acoustic waves propagate in the X-axis direction). The piezoelectric film has, for example, a thickness of 600 nm. The high acoustic velocity supporting substrate is a substrate that supports the low acoustic velocity film, the piezoelectric film, and the interdigital transducer electrode 54. Furthermore, the high acoustic velocity supporting substrate is a substrate in which the acoustic velocity of bulk waves in the high acoustic velocity supporting substrate is higher than that of acoustic waves, such as surface acoustic waves and boundary waves that propagate on the piezoelectric film and functions such that surface acoustic waves are shut in a part in which the piezoelectric film and the low acoustic velocity film are laminated and do not leak below the high acoustic velocity supporting substrate. The high acoustic velocity supporting substrate is, for example, a silicon substrate and has a thickness of, for example, 200 μm. The low acoustic velocity film is a film in which the acoustic velocity of bulk waves in the low acoustic velocity film is lower than that of bulk waves propagating in the piezoelectric film and is arranged between the piezoelectric film and the high acoustic velocity supporting substrate. With this structure and characteristics of acoustic waves whose energy is essentially focused on a medium of a low acoustic velocity, leakage of surface acoustic wave energy outside an interdigital transducer electrode can be suppressed. A low acoustic velocity film is, for example, a film containing silicon dioxide as a main component and has a thickness of, for example, 670 nm. With this multilayer structure, a Q value at the resonant frequency and the anti-resonant frequency can be significantly increased, compared to the structure in which the piezoelectric substrate 50 is used as a single layer. That is, a surface acoustic wave resonator having a high Q value can be configured, and therefore, a filter with a low insertion loss can be configured using the surface acoustic wave resonator.

A high acoustic velocity supporting substrate may have a structure in which a supporting substrate and a high acoustic velocity film in which the acoustic velocity of propagating bulk waves is higher than that of acoustic waves, such as surface acoustic waves and boundary waves propagating on the piezoelectric substrate are laminated. In this case, sapphire, a piezoelectric body such as lithium tantalate, lithium niobite, or crystal, various ceramics such as alumina, magnesia, silicon nitride, aluminum nitride, silicon carbide, zirconia, cordierite, mullite, steatite, or forsterite, a dielectric such as glass, a semiconductor such as silicon or gallium nitride, or a resin substrate may be used as the supporting substrate. Furthermore, various high acoustic velocity materials such as aluminum nitride, aluminum oxide, silicon carbide, silicon nitride, silicon oxynitride, DLC film, or diamond, a medium containing the above material as a main component, a medium containing a mixture of the above materials as a main component, or the like may be used for the high acoustic velocity film.

Furthermore, in the radio frequency filter circuits and the duplexers according to the first to fifth embodiments and the modifications of the first to fifth embodiments, an inductance element or a capacitance element may be connected between an input terminal, an output terminal, and a common terminal.

Furthermore, in the radio frequency filter circuits and the duplexers according to the first to fifth embodiments and the modifications of the first to fifth embodiments, a configuration including a single resonator has been explained for the sake of convenience. However, a configuration including a plurality of resonators that are serially divided may be provided.

INDUSTRIAL APPLICABILITY

The present disclosure may be widely used, as a compact filter, duplexer, front end circuit, and communication apparatus that may be applied to a multiband and multimode system exclusively using adjacent bands, for communication apparatuses such as cellular phones.

REFERENCE SIGNS LIST

1: antenna element
2: RF front end circuit
3: RF signal processing circuit (RFIC)
11a, 11b, 54: interdigital transducer electrode
21A, 21B, 21C, 22SW, 23, 23SW, 222SW, 223SW, 224SW, 225SW, 226SW, 227SW, 262SW, 263SW, 264SW, 523, 524, 651, 652, SW1, SW2, SW3, SW4: switch
22A, 22D, 22E, 22F, 22G, 22H, 22J, 23A, 23B, 522A: radio frequency filter circuit
22A1, 22A2: transmission characteristics
22B, 22C: radio frequency filter
22K, 661, 662, 663, 664: duplexer
22L: inductor
22m, 23m, 220t: input terminal
22n, 23n, 220r: output terminal
22p1, 22p2, 22p21, 22p22, 22p23, 22p24, 23p1, 23p2, 221p, 222p1, 222p2, 223p1, 223p2, 224p1, 224p2, 225p1, 225p2, 226p11, 226p2, 227p11, 227p2, 261p1, 262p11, 262p2, 263p11, 263p2, 264p1, 264p2: parallel-arm resonator
22s, 23s, 221s, 222s, 223s, 224s, 261s, 262s, 263s, 264s: series-arm resonator
23k: wiring
24: power amplifier
50: piezoelectric substrate
55: protection layer
100: wiring board
101: resin member
110a, 110b: electrode finger
111a, 111b: busbar electrode
220c: common terminal
250: longitudinally-coupled resonator
522A1, 522A2: transmission-side filter,
541: close contact layer
542: main electrode layer
601: demultiplexer
603, 604: terminal
609: antenna
610: LPF (low pass filter)
620, 630, BPF (band pass filter)
640: HPF (high pass filter)

The invention claimed is:

1. A radio frequency filter circuit comprising:
a series-arm resonator that is connected in a path between an input terminal of the filter circuit and an output terminal of the filter circuit;
a first parallel-arm resonator that is connected between a ground terminal and a node on the path;
a second parallel-arm resonator that is connected between the node and the ground terminal; and
a switch connected in series with the second parallel-arm resonator and configured to selectively control an electrical connection between the node, the second parallel-arm resonator, and the ground terminal,
wherein the second parallel-arm resonator and the switch are connected in parallel with the first parallel-arm resonator,
wherein a resonant frequency of the first parallel-arm resonator is less than a resonant frequency of the series-arm resonator, and
wherein a resonant frequency of the second parallel-arm resonator is greater than the resonant frequency of the first parallel-arm resonator.

2. The radio frequency filter circuit according to claim 1, wherein the resonant frequency of the second parallel-arm resonator is greater than the resonant frequency of the series-arm resonator and is less than an anti-resonant frequency of the series-arm resonator.

3. The radio frequency filter circuit according to claim 1, wherein when the second parallel-arm resonator is not electrically connected to ground, the radio frequency filter circuit is configured to pass a radio frequency signal in a first frequency band from the input terminal to the output terminal,
wherein when the second parallel-arm resonator is electrically connected to ground, the radio frequency filter circuit is configured to pass a radio frequency signal in a second frequency band from the input terminal to the output terminal, the second frequency band being different from the first frequency band, and
wherein an upper end of the second frequency band is less than an upper end of the first frequency band.

4. The radio frequency filter circuit according to claim 3, wherein the first frequency band and the second frequency band partially overlap or are adjacent to each other.

5. The radio frequency filter circuit according to claim 1, further comprising a plurality of resonant circuits connected in parallel between the node and the ground terminal, each of the plurality of resonant circuits comprising a respective resonator and a corresponding switch connected in series, and
wherein resonant frequencies of the resonators in each of the plurality of resonant circuits are different from each other.

6. A radio frequency front end circuit comprising:
the radio frequency filter circuit according to claim 5; and
a controller configured to individually control each of the switches of the radio frequency filter circuit.

7. The radio frequency filter circuit according to claim 1, further comprising:
an inductor connected in series between the second parallel-arm resonator and the switch.

8. The radio frequency filter circuit according to claim 1, wherein a capacitance of the switch is 0.8 pF or less when the switch is not in a state that electrically connects the node to the ground terminal.

9. The radio frequency filter circuit according to claim 1, wherein a characteristic impedance of wiring that connects the second parallel-arm resonator and the switch is 20 Ohms or more.

10. The radio frequency filter circuit according to claim 1, further comprising:
a longitudinally-coupled filter circuit that is arranged between the input terminal and the output terminal.

11. The radio frequency filter circuit according to claim 1, wherein the series-arm resonator, the first parallel-arm resonator, and the second parallel-arm resonator are surface acoustic wave resonators or acoustic wave resonators using bulk acoustic waves.

12. The radio frequency filter circuit according to claim 11, wherein the series-arm resonator, the first parallel-arm resonator, and the second parallel-arm resonator include interdigital transducer electrodes formed on a piezoelectric substrate.

13. The radio frequency filter circuit according to claim 1, wherein the switch is an FET switch formed of GaAs or CMOS or is a diode switch.

14. A duplexer comprising:
a transmission-side filter circuit or a reception-side filter circuit,
wherein the transmission-side filter circuit or the reception-side filter circuit comprises the radio frequency filter circuit according to claim 1.

15. A multi-stage radio frequency filter circuit comprising at least two filter stages, each filter stage comprising the radio frequency filter circuit according to claim 1.

16. A radio frequency front end circuit comprising:
a power amplifier configured to amplify a radio frequency transmission signal;
the radio frequency filter circuit according to claim 1 through which the radio frequency transmission signal amplified by the power amplifier passes; and
a controller configured to control the switch of the radio frequency filter circuit.

17. A communication apparatus comprising:
an RF signal processing circuit that processes a baseband signal or a radio frequency signal; and
the radio frequency front end circuit according to claim 16.

18. A radio frequency front end circuit comprising:
the radio frequency filter circuit according to claim 1 through which a radio frequency reception signal received by an antenna element passes;
a low noise amplifier configured to amplify the radio frequency reception signal output from the radio frequency filter circuit; and
a controller configured to control the switch of the radio frequency filter circuit.

19. A communication apparatus comprising:
an RF signal processing circuit that processes a baseband signal or a radio frequency signal; and
the radio frequency front end circuit according to claim 18.

* * * * *